(12) United States Patent
Matsumoto et al.

(10) Patent No.: US 6,798,679 B2
(45) Date of Patent: Sep. 28, 2004

(54) SEMICONDUCTOR MEMORY MODULE

(75) Inventors: Yasuhiro Matsumoto, Hyogo (JP); Shinji Tanaka, Hyogo (JP); Seiji Sawada, Hyogo (JP); Susumu Tanida, Hyogo (JP); Takahiko Fukiage, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 51 days.

(21) Appl. No.: 10/286,756

(22) Filed: Nov. 4, 2002

(65) Prior Publication Data

US 2003/0218216 A1 Nov. 27, 2003

(30) Foreign Application Priority Data

May 21, 2002 (JP) ........................................ 2002-146326

(51) Int. Cl.[7] ................................................ G11C 5/04
(52) U.S. Cl. ............................ 365/52; 365/63; 365/200
(58) Field of Search ............................ 365/52, 63, 200, 365/225.7

(56) References Cited

U.S. PATENT DOCUMENTS 5,299,160 A * 3/1994 Mori ........................... 365/200
5,303,192 A * 4/1994 Baba ........................... 365/200
5,483,491 A * 1/1996 Yoshioka et al. ............ 365/200
5,768,173 A * 6/1998 Seo et al. ....................... 365/52
6,026,008 A * 2/2000 Feese ............................. 365/63
6,545,931 B2 * 4/2003 Hidaka .......................... 365/227

FOREIGN PATENT DOCUMENTS

JP 9-64274 3/1997

* cited by examiner

Primary Examiner—Tan T. Nguyen
(74) Attorney, Agent, or Firm—McDermott Will & Emery LLP

(57) ABSTRACT

A bare chip is provided with a pad for activation/deactivation control to which a deactivation control signal for converting a bare chip that has been detected as being defective into the deactivated condition is inputted. When a deactivation control signal is inputted to the pad for activation/deactivation control, internal circuit prevent a signal that has been inputted from the pad for data input/output control from being inputted to an internal circuit located further inside than the input buffer circuit. Thereby, the bare chip that has been detected as being defective can be converted to the deactivated condition. As a result, a semiconductor memory module can be obtained that can be repaired by newly mounting a good function chip without allowing the bare chip that has been detected as being defective to interfere with the functions of the semiconductor memory module.

7 Claims, 24 Drawing Sheets

SEMICONDUCTOR MEMORY MODULE

BACKGROUND OF THE INVENTION

1. Field of the Invention

The present invention relates to a semiconductor memory module wherein semiconductor chips are mounted on a module substrate.

2. Description of the Background Art

A semiconductor memory device is, in many cases, utilized in a personal computer, a workstation or the like. In addition, in recent years the speed, degree of compactness and number of functions of personal computers have been increased and, therefore, semiconductor memory devices have been required to further increase their memory capacity. In addition, the market has expanded so that a large number of low-cost memory devices are used. Therefore, further increase in the capacity of and further reduction in costs of semiconductor memory devices have become required.

The number of DRAMs (Dynamic Random Access Memory), from among the above described semiconductor memory devices, utilized in personal computers or the like has increased because it is advantageous from the point of view of cost per unit bit. Cost per bit unit can be reduced by increasing the diameter of wafers even in the case that the capacity is increased and, therefore, DRAMs are frequently utilized.

In a DRAM, however, cost of development, cost for high level institutions and the like have greatly increased together with the increase in the testing period of time and test costs accompanying the increase in capacity as well as the enhancement of microscopic processing technology so that whether or not those costs can be reduced has become a problem.

The bit configuration for the input to or output from a DRAM is conventionally 4 bits, 8 bits or 16 bits. Accordingly, the variety in types of bit numbers of a DRAM is small. Therefore, one module is normally made up of a plurality of DRAMs for general utilization. Thus, a semiconductor memory device such as a DRAM is, in many cases, utilized in a module condition.

FIGS. 31 and 32 show a conventional semiconductor memory module. The conventional semiconductor memory module has a structure, wherein single chips 117, in which bare chips 101, mounting islands 104, bonding wires 105 and lead frames 110 are molded into mold resins 108, are mounted on a module substrate 102, such as of an SOP (Small Outline Package) or a TSOP (Thin Small Outline Package) corresponding to a surface mounting technology wherein parts can be mounted on both sides of a printed circuit board.

In addition, development has progressed of a memory package having a basic tendency toward miniaturization and thinning together with enhancement of performance and of functions of a memory chip. Then, though an insertion system has been adopted for a memory package, in recent years the forms of packages have greatly changed such that a surface mounting system has started to be adopted.

At present, the surface mounting system has become the main trend in place of the insertion system and further miniaturization and lightening of a package are strongly required. Up to the present, simplification of design and increase in reliability, as well as reduction in cost, have been achieved by utilizing a semiconductor memory module.

In addition, in a conventional manufacturing process of a semiconductor memory module, in the case that a defective chip is discovered in a module test after the manufacture of a semiconductor memory module, testing and replacement of such a defective chip are carried out until such defect has been removed.

There is a problem wherein a great amount of time and effort are required for the above described replacement of a memory chip that has been detected as being defective according to the conventional manufacturing process of a semiconductor memory module. Though there is a memory module in the form of a COB (Chip On Board) as a semiconductor memory module for solving this problem, a bare chip that has been detected as being defective cannot be replaced with a new good bare chip after bare chips have been sealed into a mold according to the conventional module in the form of the COB. Therefore, there is a problem wherein the memory module in the form of the COB cannot be repaired after the bare chips have been sealed into the mold.

SUMMARY OF THE INVENTION

An object of the present invention is to provide a semiconductor memory module wherein, even in the case that a semiconductor chip is detected as being defective after semiconductor chips are mounted on a module substrate, semiconductor chips other than the semiconductor chip that has become defective from among the plurality of semiconductor chips are effectively utilized and the semiconductor chip that has become defective can be repaired by newly mounting a good function chip (nondefective chip; The chip function without any problem in usual use) without interfering with the functions of the semiconductor memory module.

In order to achieve the above described object, it is necessary to prevent the semiconductor chip that has been detected as being defective from interfering with the input/output of data to/from the good chip for repair when operating. Therefore, the semiconductor chip that has been detected as being defective must be converted to the deactivated condition. Then, the semiconductor memory modules according to the respective aspects of the present invention shown below allow the semiconductor chips to be converted to the deactivated condition. In the following, the semiconductor memory modules of the respective aspects of the present invention that can achieve the above described object will be described.

A semiconductor memory module of the first aspect of the present invention has the following structure. The semiconductor memory module has semiconductor chips mounted on a module substrate. In addition, data input/output parts are electrically connected to the semiconductor chips so that the data input/output parts input/output data to/from the semiconductor chips. In addition, the semiconductor memory module is provided with a deactivated condition signal input part that allows the input of a deactivated condition signal indicating conversion to the deactivated condition wherein data inputted from a data input/output part is not inputted to a data memory region of a semiconductor chip. In addition, a circuit for activation/deactivation control is provided within a semiconductor chip for carrying out conversion to the deactivated condition in the case that a deactivated condition signal is inputted from a deactivated condition signal input part. A plurality of units having data input/output parts, deactivated condition signal input parts and circuits for activation/deactivation control is mounted on the module substrate. The plurality of semiconductor chips includes a plurality of bare chips. In addition, the plurality of bare chips is integrally covered with a mold resin on the module substrate. In addition, the deactivated condition signal input parts are provided outside of the mold resin.

According to the above described configuration, the semiconductor chips can be converted to the deactivated condition by inputting a deactivated condition signal from the deactivated condition signal input parts after the semiconductor chips are mounted on the module substrate.

A semiconductor memory module of the second aspect of the present invention has the following structure. The semiconductor memory module has semiconductor chips mounted on a module substrate. A self-refresh determination circuit that determines whether or not self-refreshing is carried out and that outputs a first signal in the case that it has been determined to carry out self-refreshing is provided within a semiconductor chip. In addition, the semiconductor memory module is provided with a signal input part that allows the input of a second signal different from the first signal. Furthermore, a self-refresh signal output circuit for outputting a self-refresh signal indicating a semiconductor chip to be self-refreshed in at least one case among the cases where a first signal is inputted and where a second signal is inputted is provided within the semiconductor chip. A plurality of units having self-refresh determination circuits, signal input parts and self-refresh signal output circuits is mounted on the module substrate.

According to the above described configuration, a semiconductor chip can be self-refreshed by inputting a second signal from the signal input part. Accordingly, a semiconductor chip can be self-refreshed after the semiconductor chips are mounted on the module substrate. That is to say, a semiconductor chip can be converted to the deactivated condition after the semiconductor chips have been mounted on the module substrate.

A semiconductor memory module of the third aspect of the present invention has the following structure. The semiconductor memory module has semiconductor chips mounted on a module substrate. A data input/output part for inputting/outputting data to/from a semiconductor chip is electrically connected to the semiconductor chip. In addition, the semiconductor memory module is provided with a fuse for activation/deactivation control that can select whether a semiconductor chip has been converted to the activated condition or has been converted to the deactivated condition according to the mode of being blown or according to the mode of remaining unblown. In addition, the semiconductor memory module is provided, inside of a semiconductor chip, with a circuit for activation/deactivation control that carries out conversion to the deactivated condition wherein data inputted from a data input/output part is not allowed to be inputted to the data memory region of the semiconductor chip according to the mode of the fuse for activation/deactivation control. A plurality of units having data input/output parts, fuses for activation/deactivation control and circuits for activation/deactivation control is mounted on the module substrate.

According to the above described configuration, a semiconductor chip can be selected as being in the activated condition or as being in the deactivated condition according to whether or not a fuse for activation/deactivation control is blown.

A semiconductor memory module of the fourth aspect of the present invention has the following structure. The semiconductor memory module has semiconductor chips mounted on a module substrate. In addition, the semiconductor memory module of the fourth aspect of the present invention is provided with a fuse for self-refresh control that can select whether or not a semiconductor chip is self-refreshed according to the mode of being blown or according to the mode of remaining unblown. In addition, a self-refresh determination circuit that determines whether or not self-refreshing is to be carried out and that outputs a predetermined signal in the case it is determined that self-refreshing is to be carried out is provided inside of a semiconductor chip. In addition, the semiconductor memory module is provided with a self-refresh indication circuit, inside of a semiconductor chip, for outputting a signal that indicates that a semiconductor chip is to be self-refreshed in at least one case from among the cases where the self-refresh determination circuit outputs a predetermined signal and where a fuse for self-refresh control carries out self-refresh on the semiconductor chip. A plurality of units having fuses for self-refresh control, self-refresh determination circuits and self-refresh indication circuits is mounted on the module substrate.

According to the above described configuration, whether or not a semiconductor chip is converted to a self-refreshed condition can be selected according to whether or not the fuse for activation/deactivation control is blown. As a result, whether the semiconductor chip is to be converted to the activated condition or is to be converted to the deactivated condition can be selected.

A semiconductor memory module of the fifth aspect of the present invention has the following structure. The semiconductor memory module has semiconductor chips mounted on the main surface of a module substrate. In addition, a good function chip mounting region wherein a good function chip that functions so as to substitute for a semiconductor chip can be mounted is provided on the module substrate. In addition, the semiconductor memory module is provided with a signal input part that is electrically connected to a fixed potential terminal, wherein the potential is fixed, and to which a predetermined signal is inputted. In addition, the semiconductor memory module is provided with a semiconductor chip internal circuit that converts the semiconductor chip to the deactivated condition in the case that the predetermined signal is inputted from the signal input part. A plurality of units having good chip mounting regions, signal input parts and semiconductor chip internal circuits is mounted on the module substrate.

In addition, the above described fixed potential terminal is provided in a good function chip. In addition, an electrical wire is provided on the module substrate so that the fixed potential terminal and the signal input part are electrically connected in the condition wherein the good chip is mounted in the good chip mounting provision region.

According to the above described configuration, a semiconductor chip that has been detected as being defective can be converted to the deactivated condition by electrically connecting the fixed potential terminal to the signal input part because a semiconductor chip internal circuit is provided. In addition, the module substrate is provided with an electrical wire for electrically connecting the fixed potential terminal to the signal input part in the condition wherein a good function chip is mounted in the good chip mounting region and, therefore, it is only necessary to mount a good function chip in order to repair the semiconductor memory module. Accordingly, the semiconductor memory module can easily be repaired.

A semiconductor memory module of the sixth aspect of the present invention has the following structure. The semiconductor memory module has a plurality of semiconductor chips mounted on a module substrate. In addition, the plurality of semiconductor chips is electrically connected to a common power supply electrode. In addition, a plurality of disconnectable wires makes electrical connections between two or more semiconductor chips from among the plurality of semiconductor chips and the power supply electrode. In addition, the semiconductor memory module is provided with a data input/output circuit for allowing data to be inputted/outputted, in the case that a specific semiconductor chip from among the plurality of semiconductor chips has been detected as being defective, by using semiconductor chips other than the specific semiconductor chip.

According to the above described configuration, a disconnectable wire is cut so that power can be stopped from being supplied to the semiconductor chip to which the wire was electrically connected. Therefore, the semiconductor chip that has been detected as being defective and the power supply electrode are electrically disconnected. Thereby, it becomes possible to convert the bare chip to the deactivated condition.

A semiconductor memory module of the seventh aspect of the present invention has the following structure. The semiconductor memory module has semiconductor chips mounted on a module substrate. In addition, the module substrate is provided with a plurality of terminals for substrate data input/output electrically connected to a plurality of terminals for chip data input/output for inputting/outputting data to/from the semiconductor chips in a one-to-one manner. In addition, a plurality of resistance elements makes electrical connections in a one-to-one manner between the plurality of terminals for substrate data input/output and the plurality of terminals for chip data input/output. A plurality of units having a plurality of terminals for chip data input/output, a plurality of terminals for substrate data input/output and a plurality of resistance elements are mounted on the module substrate. Furthermore, the plurality of resistance elements is formed so as to be removable from the semiconductor memory module.

According to the above described configuration, the plurality of resistance elements are removed from the semiconductor memory module, thereby data can be prevented from being inputted to/outputted from the semiconductor chips to which the plurality of resistance elements is electrically connected. Thereby, it becomes possible to convert the semiconductor chips to the deactivated condition.

A semiconductor memory module of the eighth aspect of the present invention has the following structure. The semiconductor memory module has semiconductor chips mounted on a module substrate. In addition, a semiconductor chip is provided with a chip clock terminal to which a clock signal that chronographically repeats the same status change is inputted. In addition, the module substrate is provided with a substrate clock terminal to which the clock signal is inputted. In addition, a first resistance element makes an electrical connection between the chip clock terminal and the substrate clock terminal. A plurality of units having chip clock terminals, substrate clock terminals and first resistance elements is provided on the module substrate. Furthermore, the first resistance elements are formed so as to be removable from the semiconductor memory module of the eighth aspect.

According to the above described configuration, a first resistance element is removed from the semiconductor memory module so that the clock signal that has been inputted via the first resistance element is not inputted to the semiconductor chip. Thereby, the semiconductor chip that has been detected as being defective can be converted to the deactivated condition.

Here, it is possible to appropriately combine the respective characteristics of the above described semiconductor memory modules of the first to eighth aspects if necessary.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

In the following, a semiconductor memory module, which is repairable after bare chips have been covered with a mold resin, according to the embodiment of the present invention will be described in reference to FIGS. 1 to 10.

The semiconductor memory module of the present embodiment is repaired, in the case that a molded bare chip is detected as being defective, by mounting, on the module substrate, a repair chip that substitutes for this bare chip.

Figure 1:
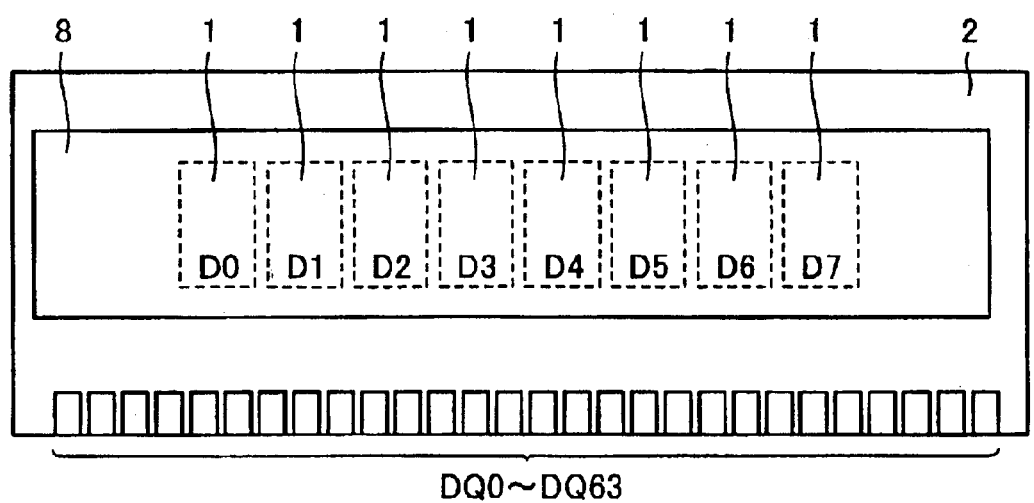
FIG. 1 is a view showing a condition wherein a plurality of bare chips mounted on a module substrate is integrally molded into a module resin in a semiconductor memory module of a first embodiment.

FIG. 1 shows the semiconductor memory module of the embodiment. As shown in FIG. 1, in the semiconductor memory module of the embodiment, a plurality of bare chips 1 are directly mounted on one of the main surfaces of a module substrate 2 and the plurality of bare chips 1 are integrally molded into a mold resin 8.

Figure 2:
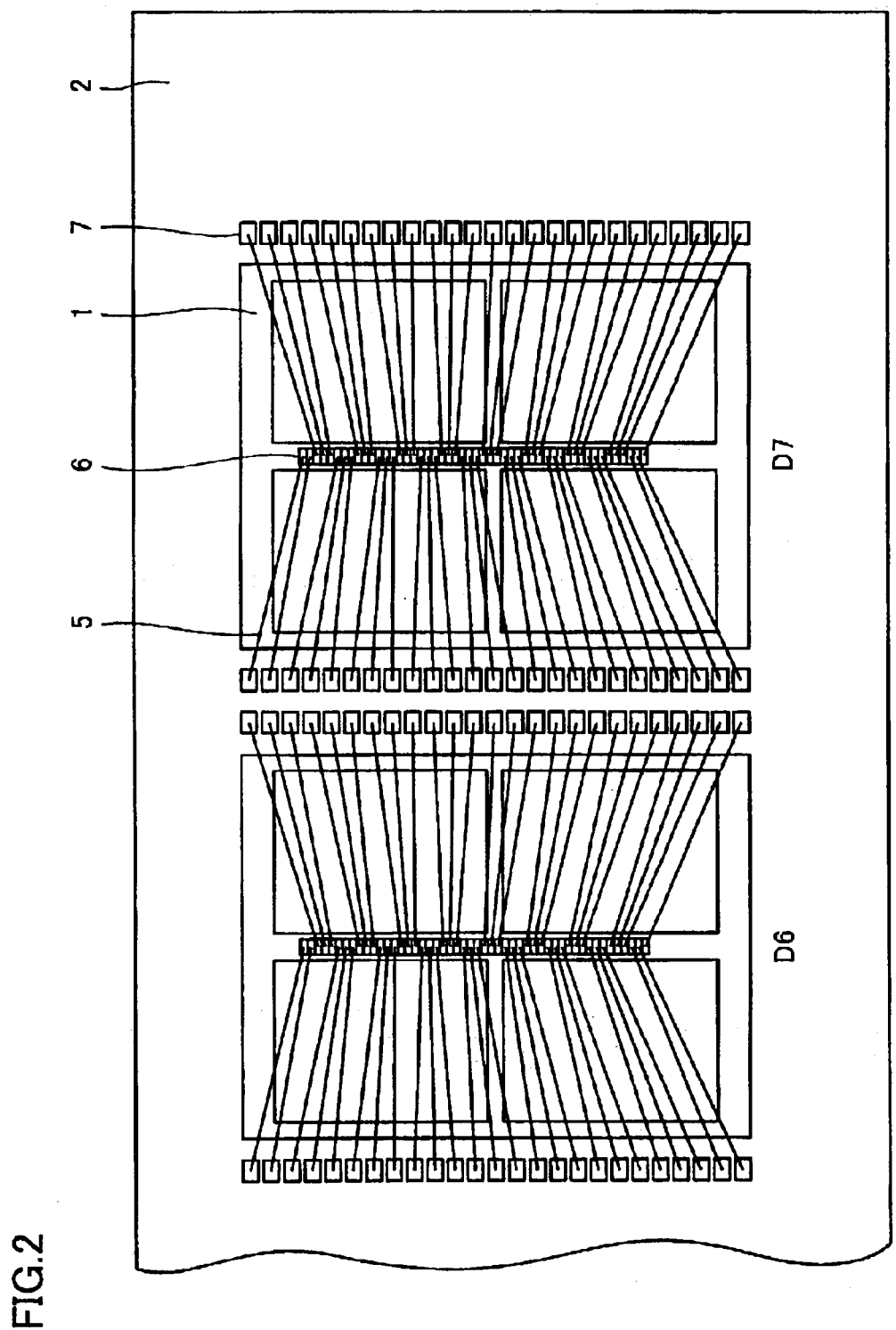
FIG. 2 is a view for describing bare chips mounted on the module substrate of the first embodiment.

In addition, as shown in FIG. 2, chip pads 6 provided on bare chips 1 and pads 7 for input/output control provided on module substrate 2 are connected by means of bonding wires 5.

Figure 3:
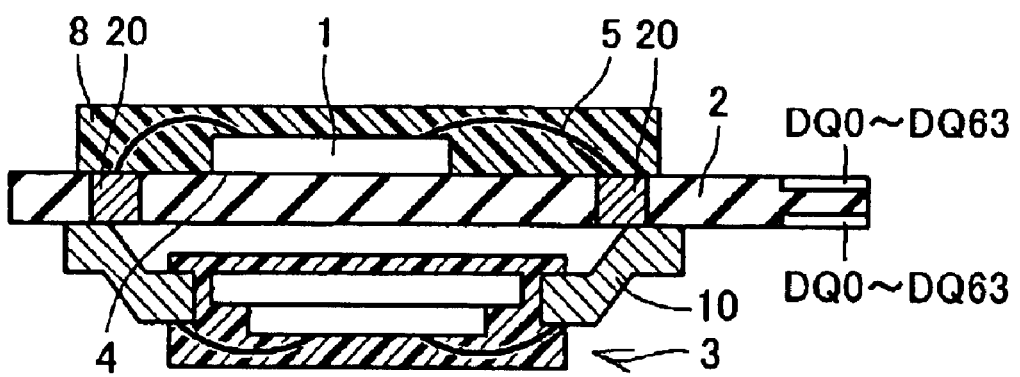
FIG. 3 is a view for describing a cross sectional structure of a bare chip and a repair chip mounted on the module substrate of the first embodiment.

In addition, the semiconductor memory module of the embodiment has a structure wherein, in the case that any bare chip 1 from among the plurality of bare chips 1 is detected as being defective, as shown in FIG. 3, a good function chip 3 used in place of bare chip 1 can be mounted on the rear side of the main surface on which the plurality of bare chips 1 are provided.

Here, though, as for the semiconductor memory module of the present embodiment, an example is shown wherein bare chips 1 are mounted on one (front surface) of the surfaces of module substrate 2 while good chips 3 are mounted on the other (rear surface) of the surfaces, both bare chips and good chips may be mounted on one of the surfaces, alone, of a module substrate, so that no chips are mounted on the other side, in the case that a large module substrate can be used.

A bare chip 1 mounted on the front surface of a semiconductor memory module 2 and a good function chip 3 used as a repair chip in place of this bare chip 1 and mounted on the rear surface of semiconductor memory module 2 utilize common electrical wires 20 shown in FIG. 3.

Therefore, in the case that good chip 3 is mounted, as shown in FIG. 3, these electrical wires 20 are electrically connected to both a plurality of bare chips 1 mounted on the front surface and to good chips 3 mounted in a plurality of repair chip mounting regions on the rear surface via through holes that penetrate module substrate 2.

In a manufacturing method for a semiconductor memory module of the present embodiment, as shown in FIG. 2, after a plurality of bare chips 1 are mounted on a module substrate 2, chip pads 6 provided on bare chips 1 and pads 7 for input/output control provided on module substrate 2 are electrically connected by means of bonding wires 5.

After that, as shown in FIG. 3, the plurality of bare chips 1 are integrally molded into a mold resin 8, thereby the semiconductor memory module is completed. Then, the completed semiconductor memory module has a structure wherein a good function chip 3 sealed in a mold can, if necessary, be mounted on the rear surface of module substrate 2.

Therefore, in the case that a defective bare chip is detected from among the plurality of bare chips 1 by means of a variety of tests, such as a system test after manufacture of the memory module, which is an example of a semiconductor memory module, a good function chip 3 is mounted on the rear surface of module substrate 2 so that good chip 3 carries out functions substituting for bare chip 1, thereby it becomes possible to repair the semiconductor memory module.

Here, it is necessary to stop the operation of bare chip 1 that has been detected as being defective in order for good chip 3 to carry out the functions of bare chip 1 that has been detected as being defective. Therefore, it becomes necessary for the semiconductor memory module to have a structure that can select the activated condition wherein bare chip 1 functions or the deactivated condition wherein bare chip 1 does not function.

A semiconductor memory module of the present embodiment is formed so that it is possible to obtain a condition wherein a good function chip 3 carries out the functions of a bare chip 1 that has been detected as being defective by using the below described activation/deactivation selection circuit so as to control the switching of bare chip 1 mounted on a module substrate 2 from the activated condition to the deactivated condition.

Here, in the semiconductor memory module of the embodiment, a plurality of bare chips 1, together with the main surface of the module substrate, is integrally molded into a mold resin 8. Therefore, the mounting area of the semiconductor memory module can be made small.

Figure 4:
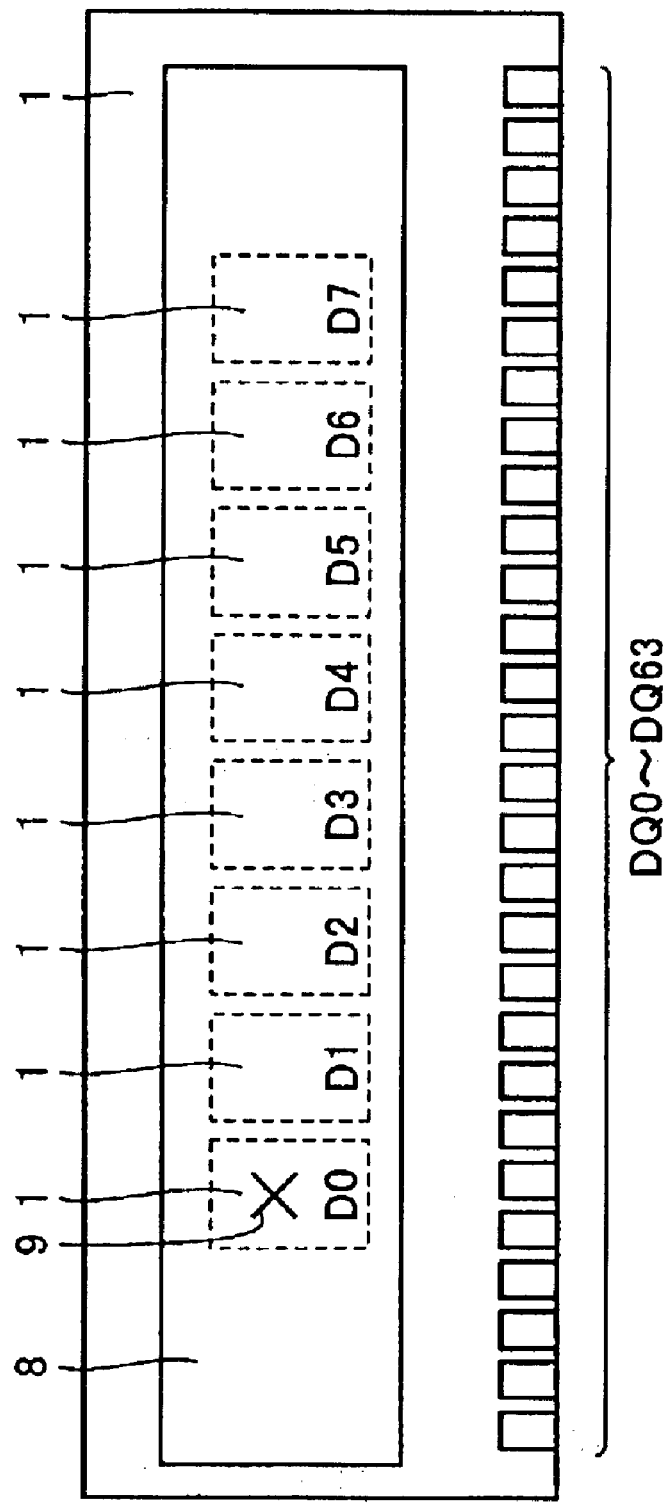
FIG. 4 is a view for describing that one of the bare chips mounted on the module substrate of the first embodiment has become a defective product.
Figure 5:
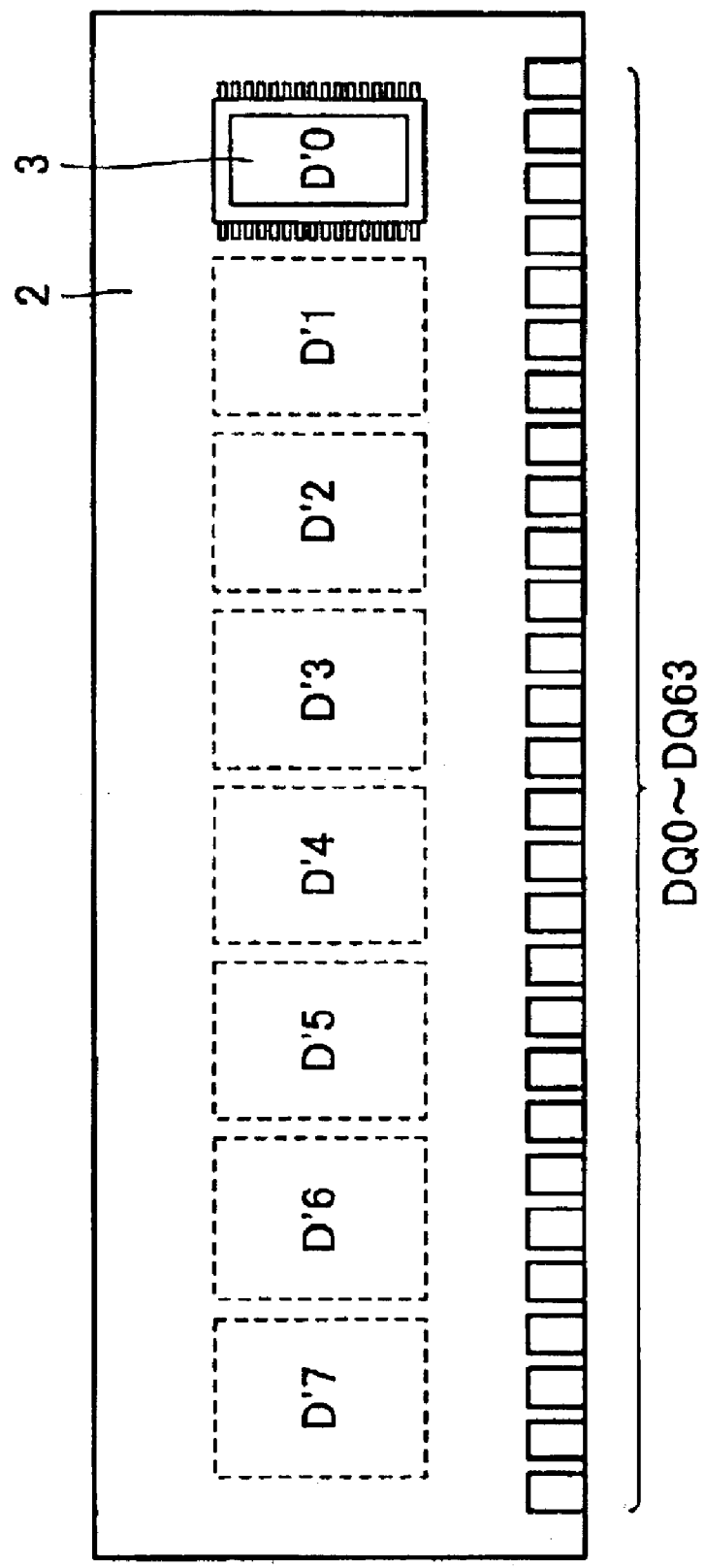
FIG. 5 is a view for describing that the semiconductor memory module is repaired by utilizing a good function chip mounted on the rear surface of the module substrate of the first embodiment.

FIGS. 4 and 5 show a configuration example of a module substrate after repair. As shown in FIGS. 4 and 5, in the semiconductor memory module, bare chips 1 (D0 to D7) are mounted on the front surface of module substrate 2 while good chip mounting provision regions for good chips 3 (D'0 to D'7), mounted at the time of repair, are provided on the rear surface.

Figure 6:
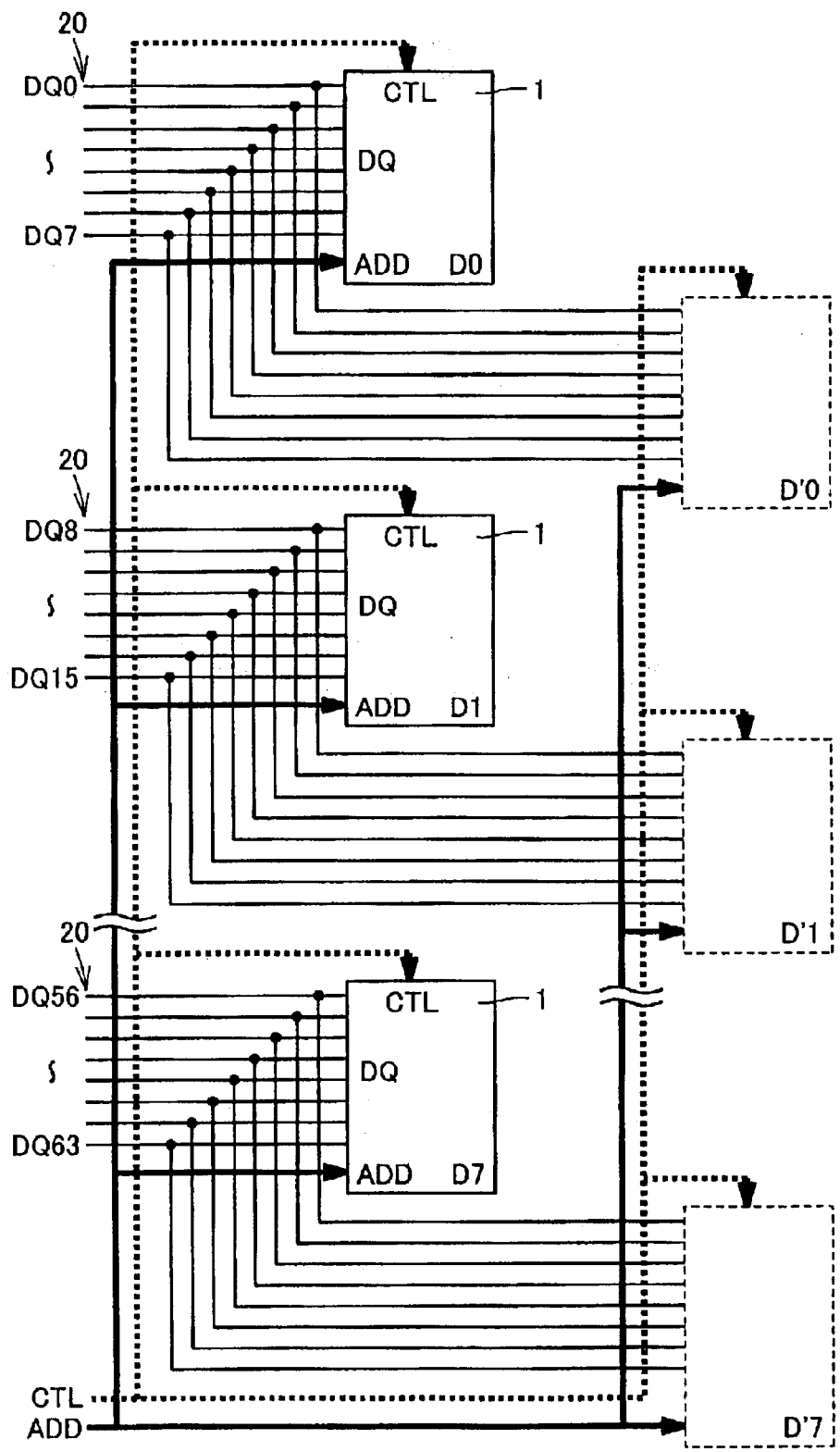
FIG. 6 is a diagram for describing a configuration of a module substrate before repair of the first embodiment.
Figure 7:
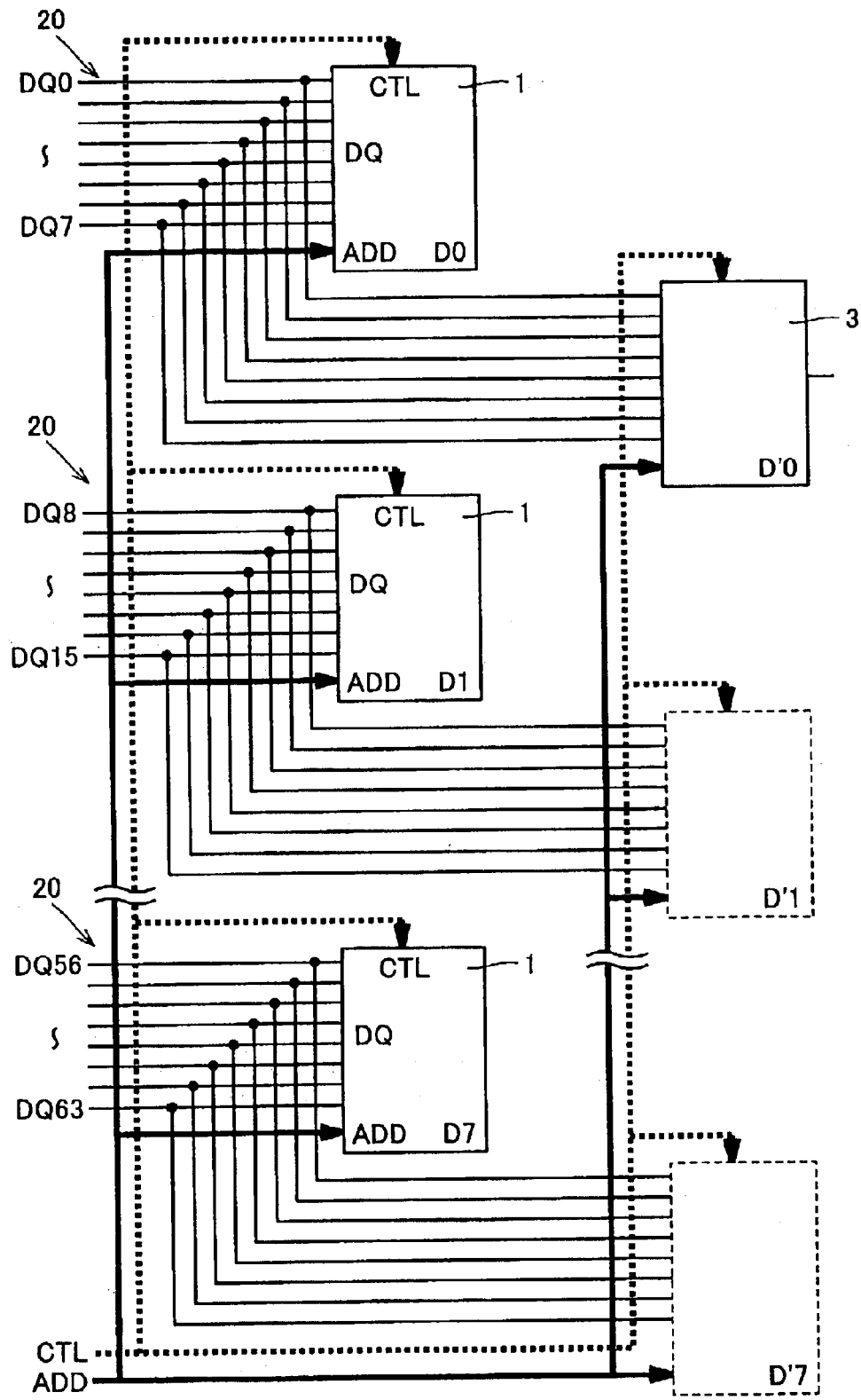
FIG. 7 is a diagram for describing a configuration of a module substrate after repair of the first embodiment.

FIG. 6 shows a block diagram of the front and rear surfaces of module substrate 2 on which bare chips 1 (D0 to D7) are mounted before repair. FIG. 7 shows a block diagram of the front surface and of the rear surface of module substrate 2 on which single good chips 3 in a mold (D'0 to D'7) utilized at the time of repair are mounted.

Here, bare chips 1 (D0 to D7) and good chips 3 (D'0 to D'7) utilize data input/output terminals DQ0 to DQ63 connected to common electrical wires 20, respectively. Here, data input/output terminals DQ0 to DQ63 are terminals connected to other circuits or memories for data input/output at these other circuits or memories.

The configuration of the semiconductor memory module before repair shown in FIG. 6 is not problematic because good chip 3 is not mounted. However, in the configuration of the semiconductor memory module after repair shown in FIG. 7, bare chip 1 (D0) and good chip 3 (D'0) utilize data input/output terminals DQ0 to DQ63 that are connected to common electrical wires 20 and, therefore, input/output signals of bare chip 1 (D0) and repair chip 3 (D'0), respectively, collide with each other in the condition wherein both bare chip 1 (D0) and good chip 3 (D'0) are in operation.

Figure 8:
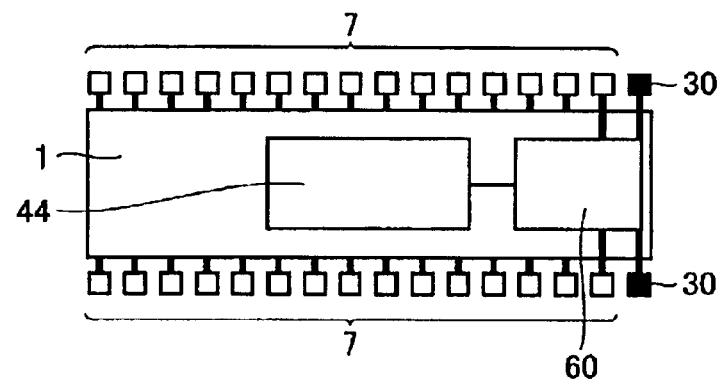
FIG. 8 is a diagram for describing an internal circuit of a bare chip of the semiconductor memory module of the first embodiment.
Figure 9:
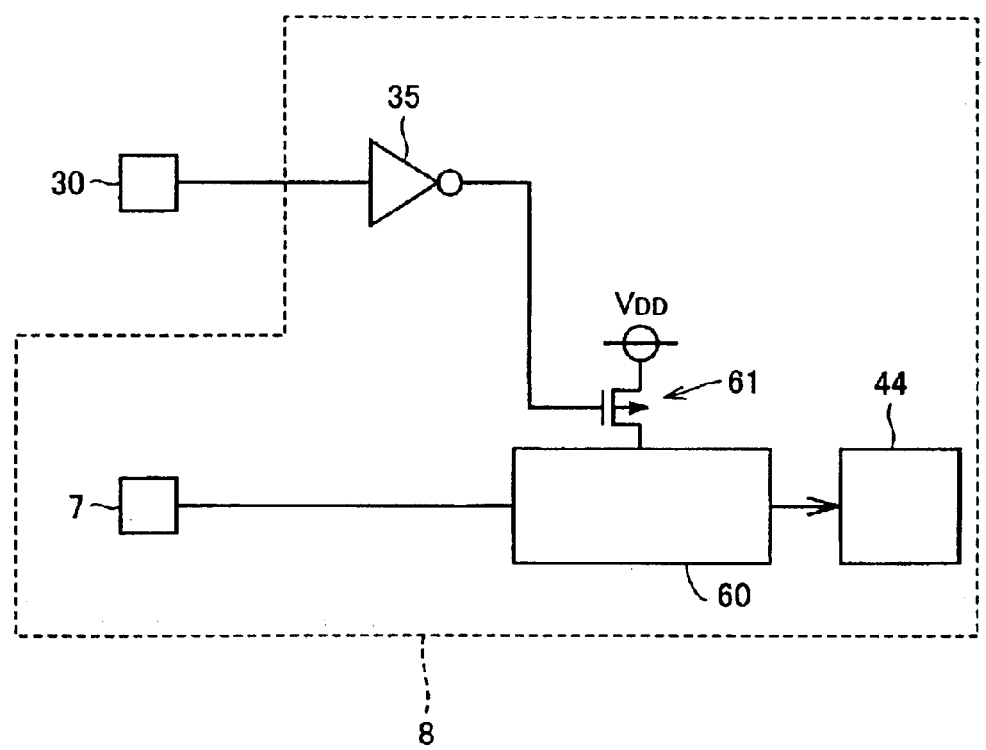
FIG. 9 is a diagram for describing a circuit for activation/deactivation control of the semiconductor memory module of the first embodiment.
Figure 10:
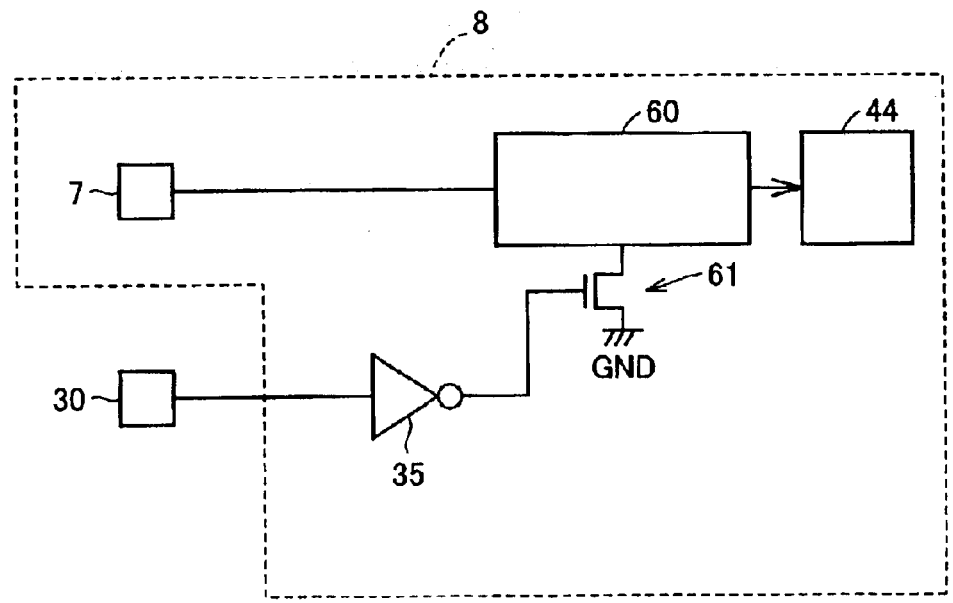
FIG. 10 is a diagram for describing another example of a circuit for activation/deactivation control of the semiconductor memory module of the semiconductor memory module of the first embodiment.

Then, the semiconductor memory module of the present embodiment solves the above described problem by using a circuit for activation/deactivation control, shown in FIGS. 8 to 10.

FIG. 8 shows a diagram of an image of the inside and the periphery of a bare chip mounted in the semiconductor memory module of the present embodiment.

In the semiconductor memory module of the present embodiment, pads 7 for input/output control for allowing a bare chip 1 to input/output a signal from/to the outside and pads 30 for activation/deactivation control from which an activation/deactivation control signal is inputted for switching bare chip 1 between the activated condition and the deactivated condition are provided on a module substrate 2. Pads 7 for input/output control and pads 30 for activation/deactivation control, respectively, are electrically connected to an input buffer circuit 60.

Here, though pads 30 for activation/deactivation control may be provided inside of a mold resin 8, in the case that they are provided outside of mold resin 8, as shown in FIGS. 9 and 10, the semiconductor memory module can be repaired even after the plurality of bare chips 1 is covered with mold resin 8.

In addition, as shown in FIG. 9, the semiconductor memory module of the present embodiment is provided with a circuit for activation/deactivation control. The circuit for activation/deactivation control, shown in FIG. 9, is provided inside of a bare chip 1.

In addition, in the circuit for activation/deactivation control, when a deactivation control signal from among the above described activation/deactivation control signals is inputted from pads 30 for activation/deactivation control, the source electrode and the drain electrode of a transistor 61 connected to an input buffer circuit 60 are electrically connected to each other.

Thereby, the current that has flown from power supply electrode $V_{DD}$ flows into input buffer circuit 60. As a result, current that has flown from pads 7 for input/output control is prevented from flowing into an internal circuit 44, (see FIG. 8), located further inside of bare chip 1 than input buffer circuit 60 by means of the function of input buffer circuit 60. As a result, the signal inputted from pads 7 for input/output control is prevented from being inputted to internal circuit 44 located further inside of bare chip 1 than input buffer circuit 60.

Here, a transistor that turns ON or OFF in accordance with the turning ON or OFF of transistor 61 is provided inside of input buffer circuit 60, so that whether or not data is inputted to internal circuit 44 is controlled according to the turning ON or OFF of this transistor.

FIG. 9 shows a circuit for activation/deactivation control wherein power supply terminal $V_{DD}$ is connected to a source/drain electrode of transistor 61 where a deactivation control signal inputted from pad 30 for activation/deactivation control is inputted to the gate electrode.

As shown in FIG. 10, however, this may be a circuit for activation/deactivation control wherein ground terminal GND is connected to a source/drain electrode of transistor 61 where a deactivation control signal inputted from pad 30 for activation/deactivation control is inputted to the gate electrode.

In such a configuration, the current that has flown from pad 7 for input/output control flows into ground terminal GND when transistor 61 turns ON. As a result, the signal inputted from pad 7 for input/output control is prevented from being inputted to internal circuit 44 located further inside of bare chip 1 than input buffer circuit 60.

That is to say, according to the semiconductor memory module of the present embodiment as shown in FIGS. 9 and 10, the circuit for activation/deactivation control functions so that input buffer circuit 60 prevents a signal that is expected to be inputted to internal circuit 44 from pad 7 for input/output control from being inputted to internal circuit 44 in the case that a deactivation control signal for controlling bare chip 1 to be in the deactivated condition is inputted from pad 30 for activation/deactivation control.

Here, in FIG. 10 also, a transistor that turns ON or OFF in accordance with the turning ON or OFF of transistor 61 is provided inside of input buffer circuit 60 and whether or not data is inputted to internal circuit 44 is controlled according to the turning ON or OFF of this transistor.

In the case that the above described circuit for activation/deactivation control, shown in FIG. 10, is used, bare chip 1 can be converted to the deactivated condition. Thereby, it becomes possible for a good function chip 3 to function so as to substitute for bare chip 1 that has become defective without being interfered by bare chip 1 that has become defective.

As described above, according to the semiconductor memory module of the present embodiment, even in the case that a chip is detected as being defective after chips are molded into a mold resin, bare chips other than the bare chip that has become defective from among the plurality of bare chips can be effectively utilized and the semiconductor memory module can be repaired by mounting a new good chip without allowing the bare chip that has been detected as being defective to interfere with the functioning of the semiconductor memory module.

In addition, in the semiconductor memory module of the present embodiment, a signal from the outside is not inputted to internal circuit 44 of bare chip 1 that has become defective and, therefore, a wasteful amount of power is not consumed inside of defective bare chip 1. As a result, the increase in power consumption in the repaired semiconductor memory module is restricted to be not much greater than in a semiconductor memory module that has not been repaired and that has no defective products.

In addition, though DRAMs are used for the bare chips of the semiconductor memory module of the present embodiment, it is possible to obtain the same effects as the effects obtained by semiconductor memory modules that use DRAMs when SDRAMs (Synchronous Dynamic Random Access Memory) or DDRSDRAM (Double Data Rate Synchronous Dynamic Random Access Memory) are used in place of DRAMs.

An inverter circuit 35 for outputting a signal obtained by inverting the inputted signal is provided between pad 30 for activation/deactivation control and transistor 61 in each of the circuits shown in FIGS. 9 and 10.

(Second Embodiment)

A semiconductor memory module of the present embodiment will be described in reference to FIGS. 1 to 8 and FIG. 11. The semiconductor memory module of the present embodiment has approximately the same structure as the structure of the semiconductor memory module of the first embodiment. However, the semiconductor memory module of the present embodiment differs from the semiconductor memory module of the first embodiment in the point wherein the semiconductor memory module of the present embodiment has a circuit for activation/deactivation control, shown in FIG. 11. Here, the circuit for activation/deactivation control shown in FIG. 11 may be provided together with the circuit for activation/deactivation control shown in FIGS. 9 and 10 or may be provided in place of the circuit for activation/deactivation control shown in FIGS. 9 and 10.

Figure 11:
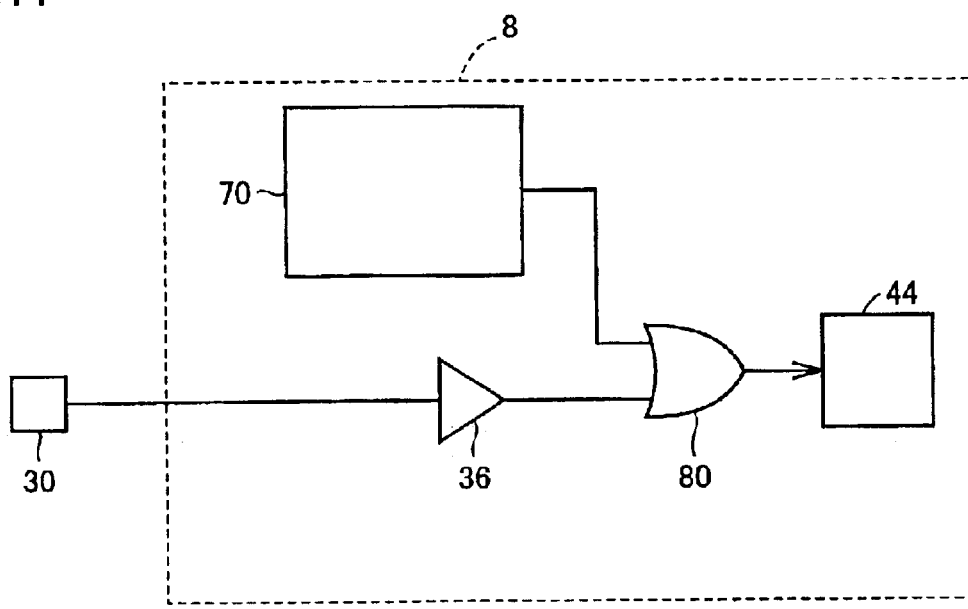
FIG. 11 is a diagram for describing a circuit for activation/deactivation control of a semiconductor memory module of a second embodiment.

As shown in FIG. 11, the semiconductor memory module of the present embodiment is provided with a self-refresh determination circuit 70 for determining whether or not memory data stored in a bank inside of bare chip 1 is automatically refreshed and for outputting a self-refresh activation signal in the case that it is determined that self-refresh is to be carried out.

In addition, the semiconductor memory module of the present embodiment is provided with pad 30 for activation/deactivation control to which an activation/deactivation control signal is inputted for switching bare chip 1 between the activated condition and the deactivated condition. In addition, the output terminal of self-refresh determination circuit 70 and the output terminal of pad 30 for activation/deactivation control are electrically connected to the two input terminals, respectively, of an OR circuit 80 having two inputs.

Here, though pad 30 for activation/deactivation control may be provided inside of mold resin 8, in the case that it is provided outside of mold resin 8 as shown in FIG. 11, the semiconductor memory module can be repaired even after the plurality of bare chips 1 is covered with mold resin 8.

In the semiconductor memory module of the present embodiment, an activation/deactivation control signal is inputted into one of the two input terminals of OR circuit 80 having two inputs after being inputted to pad 30 for activation/deactivation control. In addition, the signal outputted from the self-refresh determination circuit is inputted to the other of the two input terminals of OR circuit 80 having two inputs.

Here, in the case that either a deactivation signal for indicating that bare chip 1 is to be converted to the deactivated condition or a self-refresh activation signal is inputted to an input terminal of OR circuit 80 having two inputs, a self-refresh activation signal for refreshing internal circuit 44, (see FIG. 8), of bare chip 1 is outputted from the output terminal of OR circuit 80.

Thereby, when a signal for indicating that bare chip 1 is to be converted to the deactivated condition is inputted to pad 30 for activation/deactivation control, a self-refresh activation signal is outputted from the output terminal of OR circuit 80 even in the case that self-refresh determination circuit 70 is not outputting a self-refresh activation signal. Thereby, bare chip 1 is self-refreshed. As a result, bare chip 1 becomes of the deactivated condition.

Accordingly, bare chips other than the bare chip that has become defective from among the plurality of bare chips can be effectively utilized in the same manner as in the semiconductor memory module of the first embodiment and the semiconductor memory module can be repaired by newly mounting a good function chip without allowing the bare chip that has been detected as being defective to interfere with the function of the semiconductor memory module.

As a result, the yield of the semiconductor memory module can be improved. In addition, the power consumed by a bare chip can be reduced while a self-refresh activation signal is being outputted from OR circuit 80.

Here, in general, a constant current is consumed within a bare chip through a self-refreshing operation. In addition, a DLL circuit (Delayed Locked Loop circuit) operates at the normal operating time in a DDRSRAM. Therefore, the DLL circuit stops at the time of the self-refreshing operation, so that the amount of current consumed in the entirety of the bare chip is reduced.

(Third Embodiment)

Next, a semiconductor memory module of the third embodiment will be described in reference to FIGS. 1 to 8 and FIGS. 12 to 14. The semiconductor memory module of the present embodiment has approximately the same structure as the structures of the semiconductor memory module of the first or second embodiment.

Figure 12:
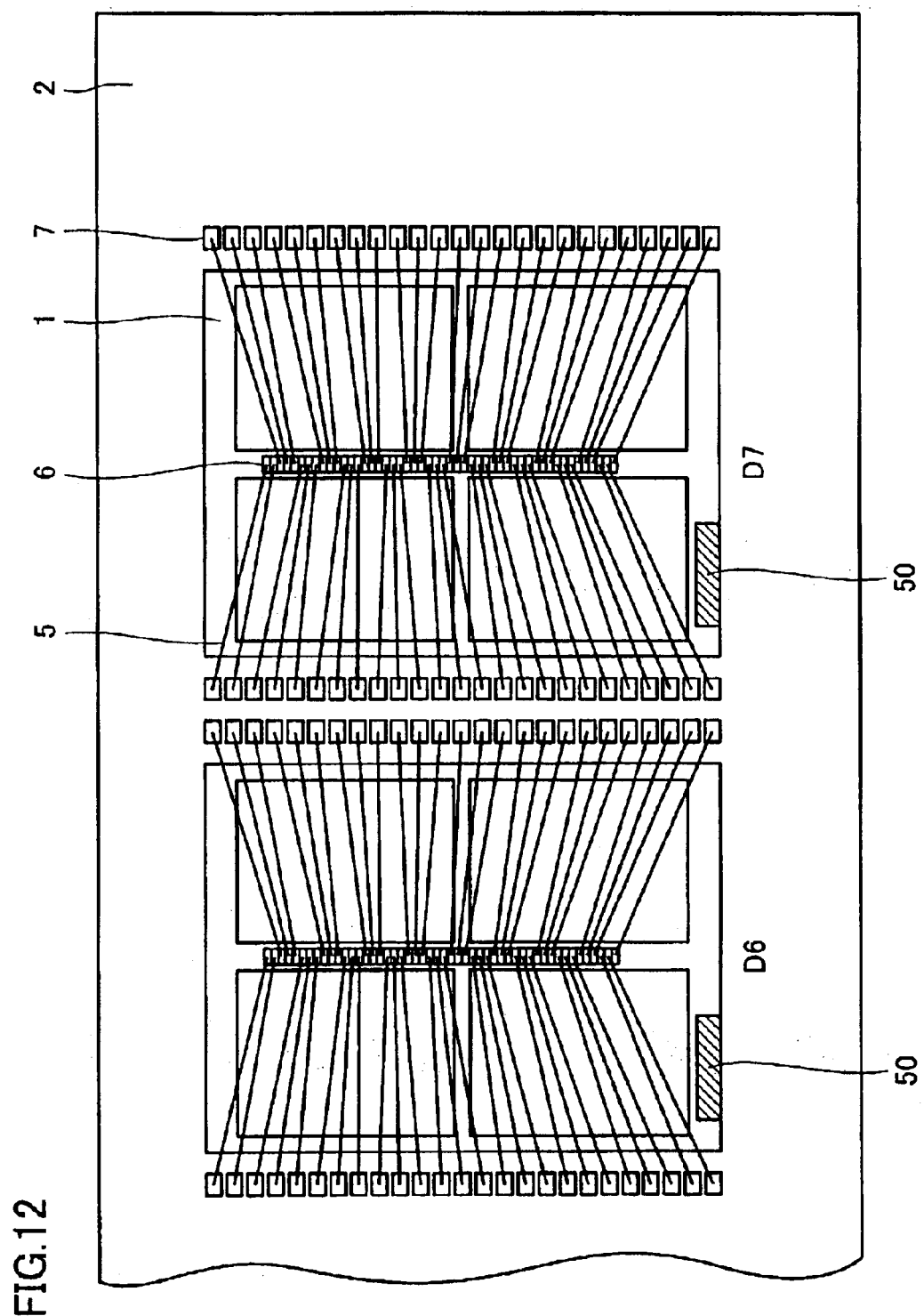
FIGS. 12 and 13 are diagrams for describing a fuse for activation/deactivation control of a semiconductor memory module of a third embodiment.
Figure 13:
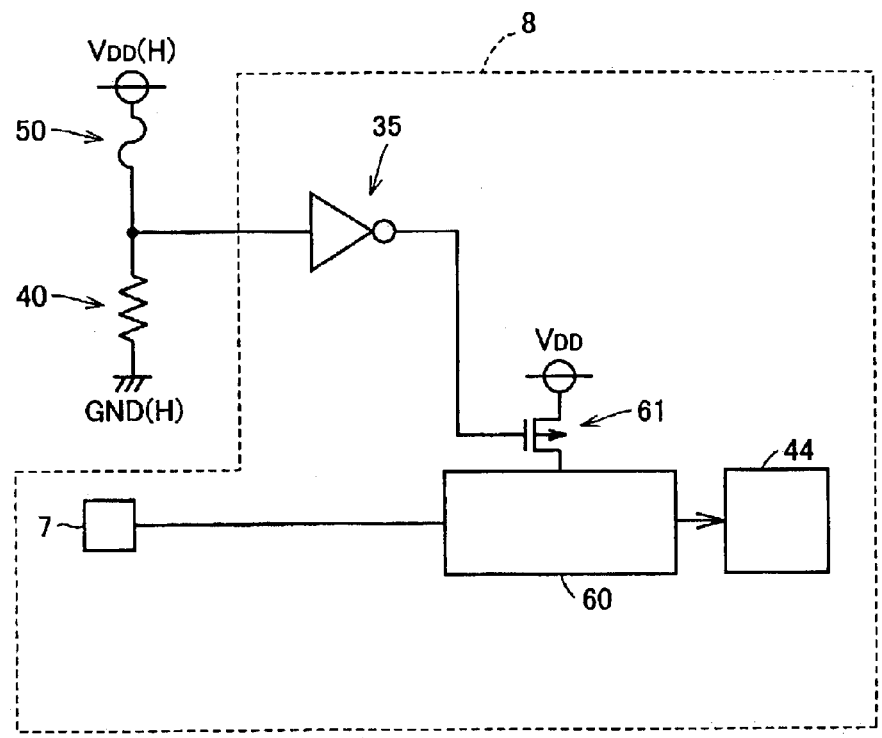
Figure 14:
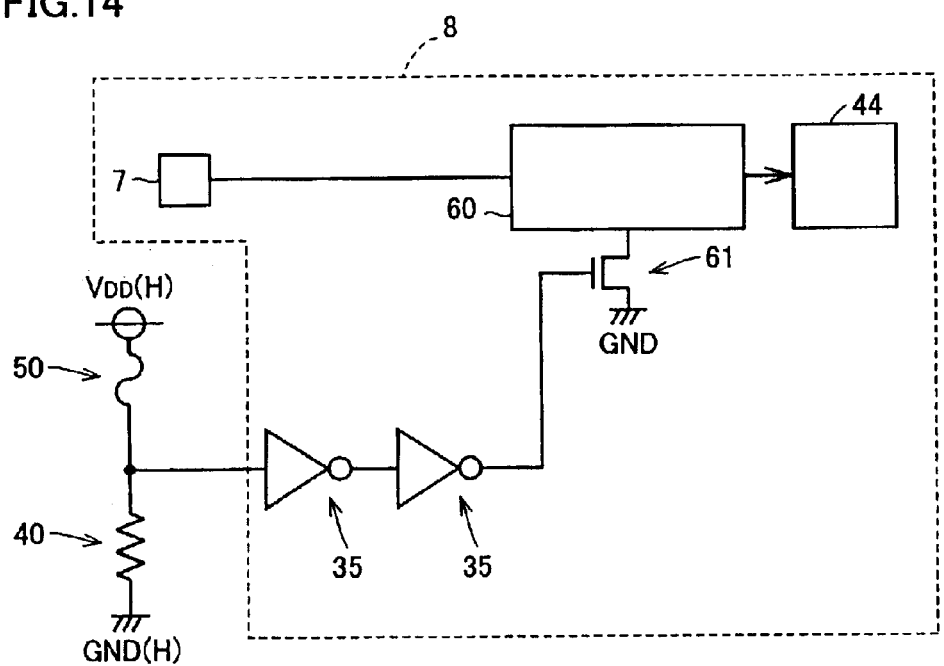
FIG. 14 is a diagram for describing another example of a fuse for activation/deactivation control of the semiconductor memory module of the third embodiment.

However, the semiconductor memory module of the third embodiment differs from the semiconductor memory module of the first or second embodiment in the point that a fuse 50 for activation/deactivation control is further mounted in the vicinity of the outer periphery of a bare chip, shown in FIG. 12, in the semiconductor memory module of the third embodiment as well as in the point that a circuit for activation/deactivation control, shown in FIG. 13, or a circuit for activation/deactivation control, shown in FIG. 14, is further provided in the semiconductor memory module of the third embodiment.

In the semiconductor memory module of the present embodiment shown in FIG. 12, fuses 50 for activation/deactivation control are mounted on module substrate 2 in order to switch bare chips 1 between the activated condition and the deactivated condition.

Here, though fuse 50 for activation/deactivation control may be provided inside of mold resin 8, in the case that it is provided outside of mold resin 8, as shown in FIGS. 13 and 14, the semiconductor memory module can be repaired after the plurality of bare chips 1 is covered with mold resin 8.

The semiconductor memory module of the present embodiment is formed so that fuse 50 for activation/deactivation control of a defective chip is made to stay unblown (uncut), thereby the bare chip can easily be converted to the deactivated condition. Accordingly, it is necessary to blow fuse 50 for activation/deactivation control of a bare chip 1 that has been determined to be good according to the result of a system test.

Described more concretely, that semiconductor memory module of the present embodiment is provided with pads 7 for input/output control that allow bare chip 1 to input/output a signal from/to the outside and fuse 50 for activation/deactivation control for switching bare chip 1 between the activated condition and the deactivated condition on module substrate 2, as shown in FIG. 13.

A power supply terminal $V_{DD}$ (H) is connected to the gate electrode of a transistor 61 that is electrically connected to an input buffer circuit 60 via fuse 50 for activation/deactivation control and an inverter circuit 35. In addition, a wire between fuse 50 for activation/deactivation control and inverter circuit 35 is connected to a ground terminal GND (H) via a resistance element 40.

In addition, as shown in FIG. 13, a circuit for activation/deactivation control of the semiconductor memory module of the present embodiment is provided with input buffer circuit 60 that is electrically connected to pad 7 for input/output control. A source/drain electrode of the transistor is electrically connected to input buffer circuit 60.

In the semiconductor memory module of the present embodiment current from power supply terminal $V_{DD}$ (H) does not flow into the gate electrode of transistor 61 under the condition wherein fuse 50 for activation/deactivation control is not blown and, therefore, the source electrode and the drain electrode of transistor 61 connected to input buffer circuit 60 are not electrically connected to each other.

Therefore, current that has flown from power supply electrode $V_{DD}$ does not flow into input buffer circuit 60. Under these conditions the data that has been inputted into pad 7 for input/output control is inputted to internal circuit 44 located further inside than input buffer circuit 60, shown in FIG. 8, via input buffer circuit 60. Here, a transistor that turns ON or OFF in accordance with the turning ON or OFF of transistor 61 is provided inside of input buffer circuit 60 and whether or not data is inputted to internal circuit 44 is controlled by the turning ON or OFF of this transistor.

On the other hand, a signal at the potential of the ground terminal GND (H) is inputted to the input terminal of inverter circuit 35 when fuse 50 for activation/deactivation control is blown in the semiconductor memory module of the present embodiment. Therefore, the signal outputted from the output terminal of inverter circuit 35 electrically connects the source electrode and the drain electrode of transistor 61 connected to input buffer circuit 60 to each other. Thereby, the current that has flown from power supply electrode $V_{DD}$ flows into input buffer circuit 60.

As a result, the current inputted to/outputted from pad 7 for input/output control is prevented from flowing into internal circuit 44, shown in FIG. 8, located further inside of bare chip 1 than input buffer circuit 60 due to the functions of input buffer circuit 60. Accordingly, the signal inputted from pad 7 for input/output control is not inputted to internal circuit 44 located further inside of bare chip 1 than input buffer circuit 60.

FIG. 13 shows a circuit for activation/deactivation control wherein transistor 61 is provided between input buffer circuit 60 and power supply terminal $V_{DD}$. However, a circuit for activation/deactivation control of another example, as shown in FIG. 14, can obtain the same effect as the effect obtained by the circuit for activation/deactivation control shown in FIG. 13.

In the circuit for activation/deactivation control of the semiconductor memory module of the above example of the present embodiment, as shown in FIG. 14, transistor 61 is provided between input buffer circuit 60 and ground terminal GND.

In addition, power supply terminal $V_{DD}$ (H) is electrically connected to the gate electrode of transistor 61 via two inverter circuits 35 that are connected in series. In addition, a fuse 50 for activation/deactivation control is provided between power supply terminal $V_{DD}$ (H) and the input terminal of inverter circuits 35. In addition, a wire between fuse 50 for activation/deactivation control and inverter circuits 35 is connected to ground terminal GND (H) via a resistance element 40.

In such a configuration the source electrode and the drain electrode of transistor 61 are electrically connected to each other under the condition wherein fuse 50 for activation/deactivation control is not blown. Thereby, the condition is obtained wherein the current that has flown from pad 7 for input/output control flows into ground terminal GND. As a result, the signal inputted from pad 7 for input/output control is prevented from being inputted to internal circuit 44, shown in FIG. 8, located further inside of bare chip 1 than input buffer circuit 60. Here, a transistor that turns ON or OFF in accordance with the turning ON or OFF of transistor 61 is provided inside of input buffer circuit 60 and whether or not data is inputted to internal circuit 44 is controlled by the turning ON or OFF of this transistor.

On the other hand, a signal at the potential of ground terminal GND is inputted to the input terminal of inverter circuits 35 under the condition wherein fuse 50 for activation/deactivation control is blown. Thereby, the source electrode and the drain electrode of transistor 61 are not electrically connected to each other. Therefore, the current that has flown from pad 7 for input/output control does not flow into ground terminal GND. As a result, the signal inputted from pad 7 for input/output control is inputted to internal circuit 44 located further inside of bare chip 1 than input buffer circuit 60.

According to the above described semiconductor memory module of the present embodiment, bare chip 1 is the deactivated condition in the case that fuse 50 for activation/deactivation control is not blown. Thereby, a good function chip 3 can carry out the functions so as to substitute for bare chip 1 that has been detected as being defective. As a result, the yield of the semiconductor memory module can be increased in the same manner as the semiconductor memory module of the first or second embodiment.

(Fourth Embodiment)

Next, a semiconductor memory module of the fourth embodiment will be described in reference to FIGS. 1 to 8, FIG. 12 and FIG. 15. The semiconductor memory module of the present embodiment has approximately the same structure as the structure of the semiconductor memory module of the first or second embodiment.

Figure 15:
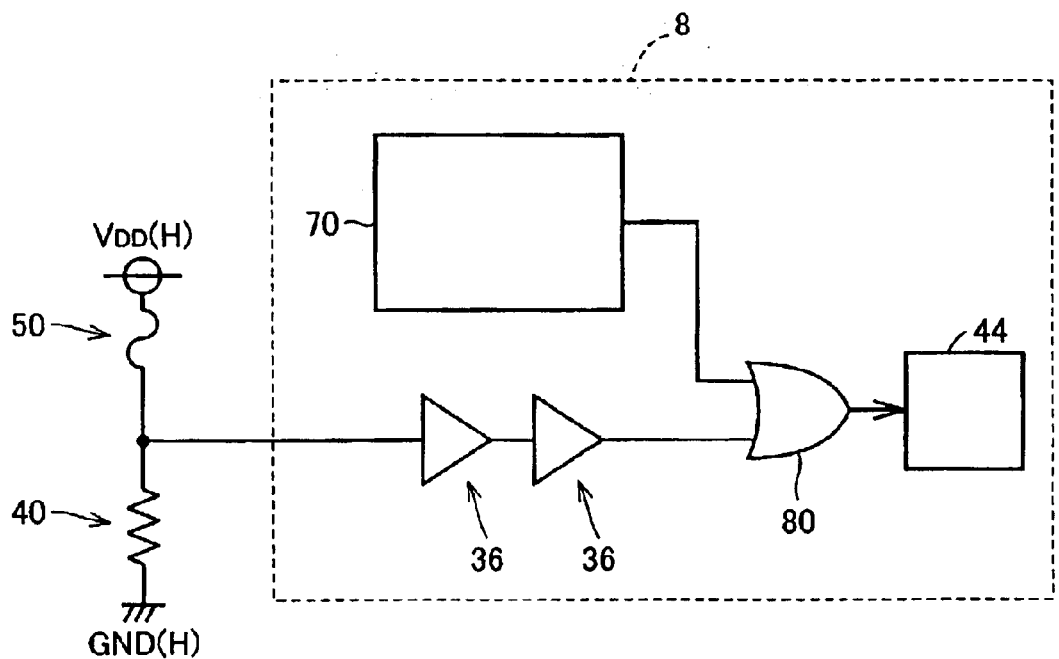
FIG. 15 is a diagram for describing a fuse for activation/deactivation control of a semiconductor memory module of a fourth embodiment.

However, the semiconductor memory module of the present embodiment differs from the semiconductor memory module of the first or second embodiment in the point that a circuit for activation/deactivation control, shown in FIG. 15, is further provided in the semiconductor memory module of the present embodiment.

The semiconductor memory module of the present embodiment has, as shown in FIG. 12, a fuse 50 for activation/deactivation control to switch a bare chip 1 between the activated condition and the deactivated condition mounted on a module substrate 2.

Here, though fuse 50 for activation/deactivation control may be provided inside of a mold resin 8, in the case that the fuse is provided outside of mold resin 8, as shown in FIG. 15, the semiconductor memory module can be repaired even after the plurality of bare chips 1 is covered with mold resin 8.

The semiconductor memory module of the present embodiment is formed so that the bare chips can easily be converted to the deactivated condition by leaving fuses 50 for activation/deactivation control of the defective chips unblown (uncut). Accordingly, it is necessary to blow fuses 50 for activation/deactivation control of bare chips 1 that have been determined as being good as a result of a system test.

In the semiconductor memory module of the present embodiment, as shown in FIG. 15, a self-refresh determination circuit 70 is provided for determining whether or not memory data inside of a bare chip 1 is automatically refreshed and for outputting a self-refresh activation signal in the case that the decision is made to carry out self-refresh. The output terminal of self-refresh determination circuit 70 is connected to one of the input terminals of an OR circuit 80 having two inputs.

In addition, the semiconductor memory module of the present embodiment is provided with a fuse 50 for activation/deactivation control to switch a bare chip 1 between the activated condition and the deactivated condition. In addition, power supply terminal $V_{DD}$ (H) is electrically connected to the other input terminal of OR circuit 80 having two inputs via two buffer circuits 36 connected in series.

In addition, fuse 50 for activation/deactivation control makes a connection between power supply electrode $V_{DD}$ (H) and an input terminal of buffer circuit 36. In addition, a electrical wire between fuse 50 for activation/deactivation control and buffer circuit 36 is connected to ground terminal GND (H) via a resistance element 40.

In the semiconductor memory module of the present embodiment, in the case that fuse 50 for activation/ deactivation control is not blown, a signal at the potential of power supply terminal $V_{DD}$ (H) is inputted to one of the input terminals of OR circuit 80 having two inputs. Therefore, a self-refresh activation signal is outputted from the output terminal of OR circuit 80 having two inputs to an internal circuit 44.

On the other hand, in the case that fuse 50 for activation/ deactivation control is blown, a signal at the potential of ground terminal GND (H) is inputted to the input terminal of buffer circuit 36 and, therefore, a self-refresh activation signal is not outputted from the output terminal of OR circuit 80 having two inputs unless the self-refresh activation signal is outputted from the output terminal of self-refresh determination circuit 70.

Accordingly, a self-refresh activation signal for refreshing internal circuit 44 of bare chip 1 is outputted from the output terminal of OR circuit 80 in, at least, either the case wherein fuse 50 for activation/deactivation control is left unblown or the case wherein self-refresh determination circuit 70 determines self-refreshing.

According to the above described semiconductor memory module of the present embodiment, bare chip 1 is the deactivated condition in the case that fuse 50 for activation/ deactivation control is not blown. Thereby, good chip 3 can carry out the functions so as to substitute for bare chip 1 that has been detected as being defective. Accordingly, the same effects as the effects obtained in the semiconductor memory modules of the first to fourth embodiments can be obtained. Here, it is necessary to blow fuse 50 for activation/ deactivation control in the case that bare chip 1 is a good product. In addition, though an example of a semiconductor memory module of the present embodiment is shown wherein bare chip 1 can be utilized in the case that the fuse for activation/deactivation control is blown, bare chip 1 may be made utilizable in the case that the fuse for activation/ deactivation control is left unblown.

(Fifth Embodiment)

A semiconductor memory module of the present embodiment will be described in reference to FIGS. 16 to 19.

A structure of the semiconductor memory module of the present embodiment, other than the structures shown in FIGS. 6 and 7, is similar to that of the semiconductor memory module of the first embodiment. In other words, the structure of the semiconductor memory module of the present embodiment is similar to the structure of the semiconductor memory module shown in FIGS. 1 to 5 and FIG. 8.

Here, the semiconductor memory module of the present embodiment utilizes any of the circuits for activation/ deactivation control shown in FIGS. 9 to 11 in the above described the first or second embodiment as a circuit for activation/deactivation control for converting bare chip 1 into the deactivated condition. Here, a QFC pad, shown in FIG. 16, is used in place of pad 30 for activation/ deactivation control in the semiconductor memory module of the present embodiment.

Figure 16:
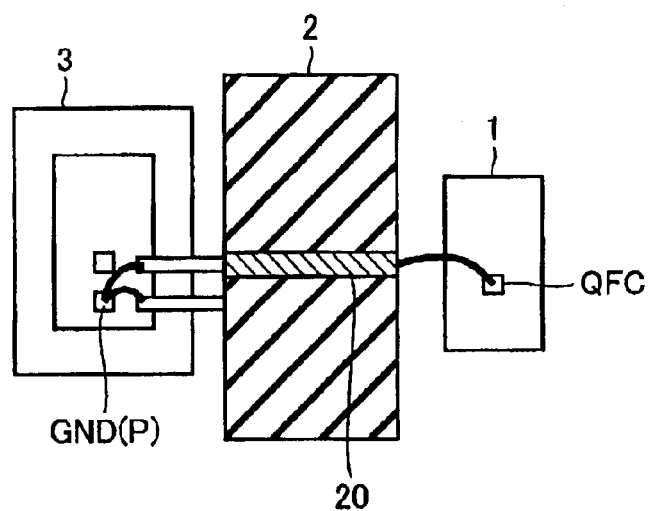
FIG. 16 is a diagram for describing a positional relationship between a QFC pad of a bare chip and a ground pad of a good function chip in a semiconductor memory module of a fifth embodiment.

In addition, the semiconductor memory module of the present embodiment is provided with an electrical wire 20 in a through hole that penetrates module substrate 2, as shown in FIG. 16. This electrical wire 20 makes a connection between a GFC pad of bare chip 1 and a ground pad GND (P) of good chip 3 for repair and the potential thereof is fixed at the ground potential. Here, though ground pad GND (P) of good chip 3 and GFC pad of bare chip 1 are connected to each other in the semiconductor memory module of the present embodiment, the power supply pad of repair chip 3, of which the potential is fixed at the power supply potential, and QFC pad of bare chip 1 may be connected to each other as long as the internal circuit of the bare chip is formed so that bare chip 1 can be converted to the deactivated condition by fixing the GFC pad at a predetermined potential.

Figure 17:
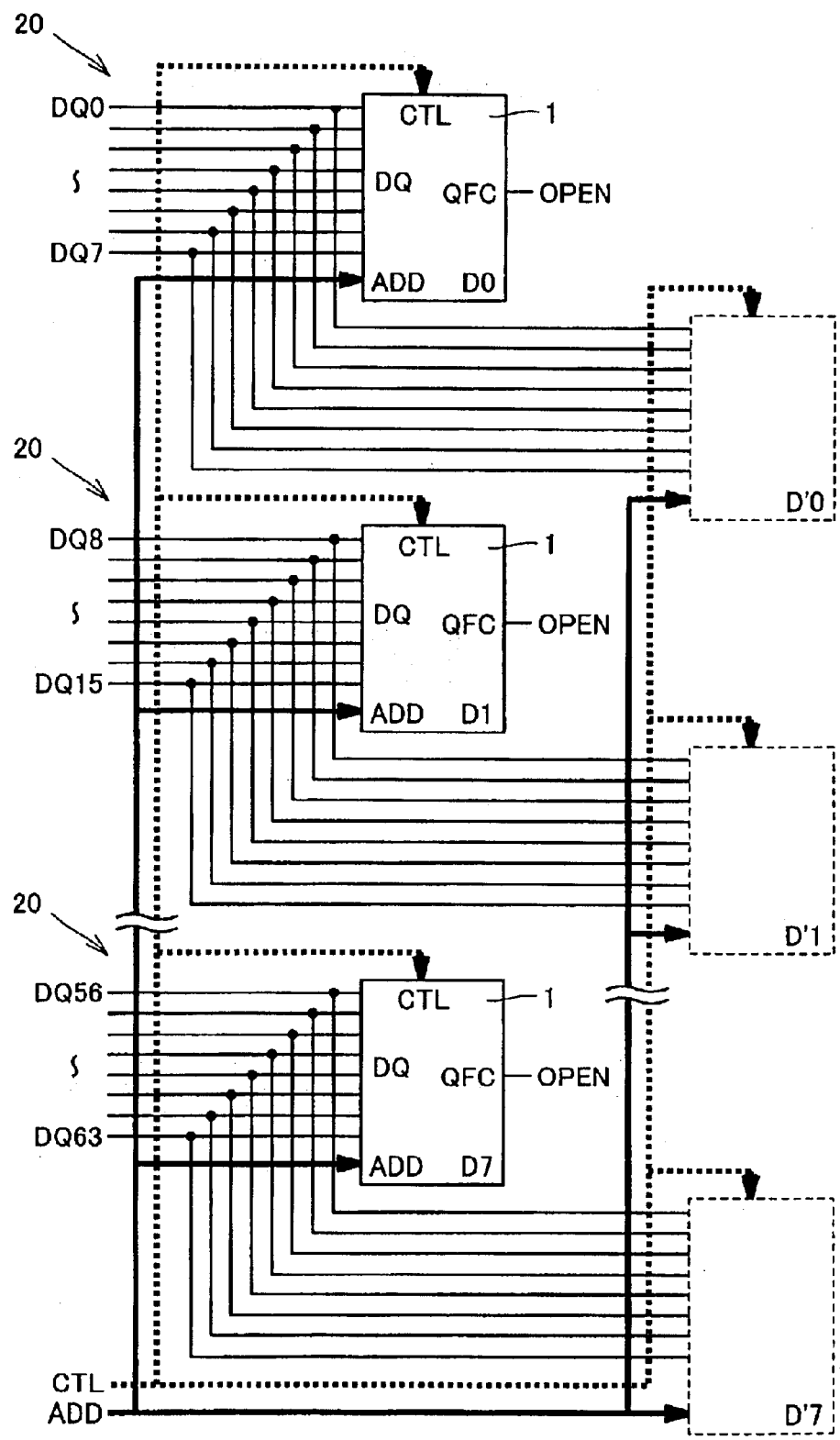
FIG. 17 is a diagram for describing a configuration of a semiconductor memory module before repair of the fifth embodiment.

FIG. 17 shows a block diagram of the front surface and the rear surface of module substrate 2 on which bare chips 1 (D0 to D7), before repair, of the semiconductor memory module of the present embodiment are mounted. As shown in FIG. 17, QFC pins (not only limited to QFC pins as long as they are normally unutilized terminals) for controlling input/output of a bare chip 1 that has been detected as being defective are provided in bare chips 1 (D0 to D7).

Figure 18:
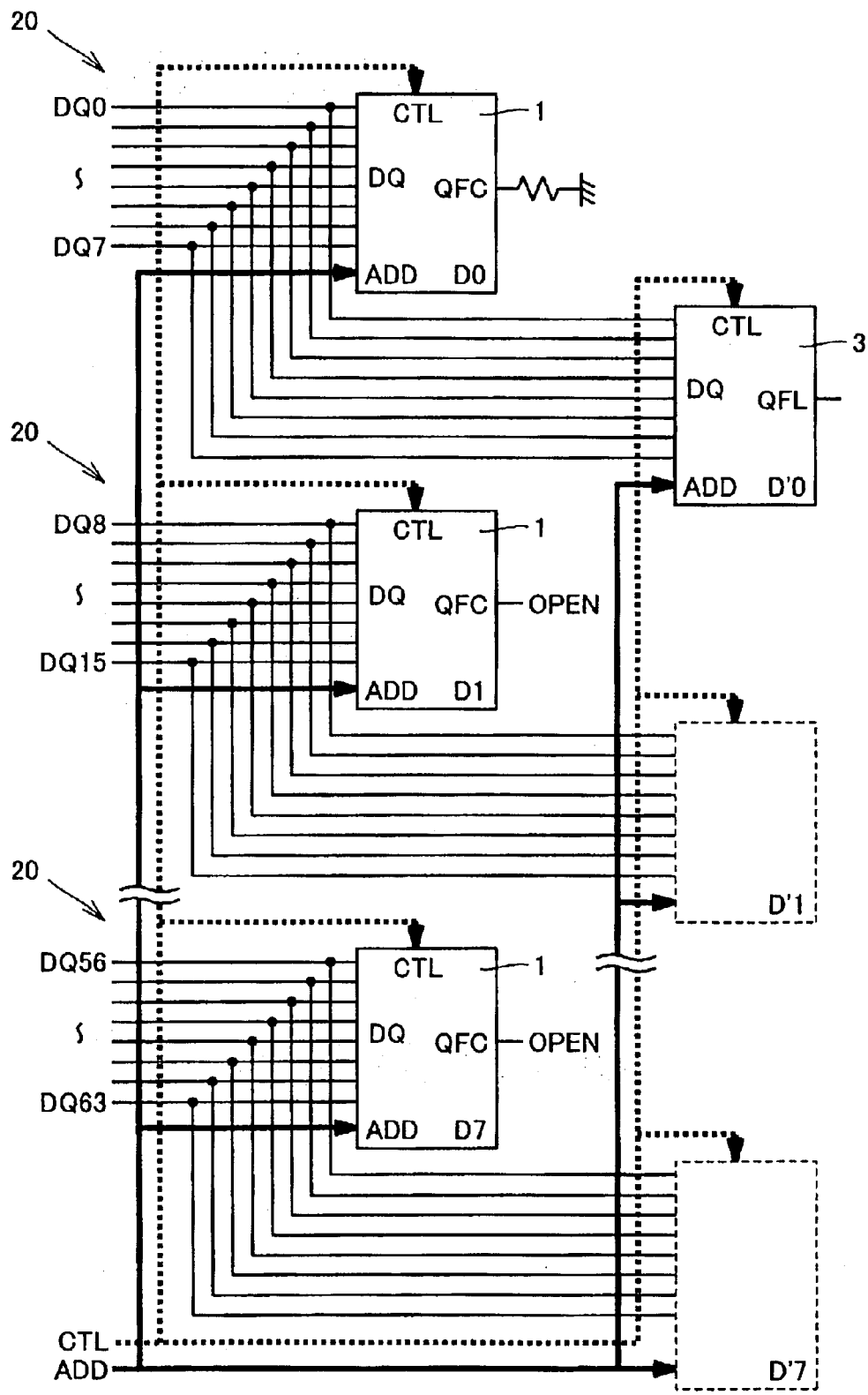
FIG. 18 is a diagram for describing a configuration of a semiconductor memory module after repair of the fifth embodiment.

In addition, FIG. 18 shows a block diagram of the front surface and the rear surface of module substrate 2 on which are mounted single good chips 3 (D'0 to D'7) sealed in molds utilized at the time of repair of the semiconductor memory module of the present embodiment. As shown in FIG. 18, good chips 3 (D'0 to D'7) are provided with QFC pins having a fixed potential in the case that a good function chip 3, which has been detected as being a defective product, is converted to the deactivated condition.

Here, bare chips 1 (D0 to D7) and good chips 3 (D'0 to D'7) utilize data input/output terminals DQ0 to DQ 63, respectively, connected to common electrical wires 20. In addition, data input/output terminals DQ0 to DQ 63 are terminals connected to other circuits or memories for data input/output between these other circuits and memories bare chips 1 or good chips 3.

The configuration of the semiconductor memory module before repair, shown in FIG. 17, is not problematic because a good function chip 3 is not mounted. However, the configuration of the semiconductor memory module after repair, shown in FIG. 18, utilizes data input/output terminals DQ0 to DQ 63 wherein bare chip 1 (D0) and good chip 3 (D'0) are connected to a common electrical wire 20.

Therefore, input/output signals of bare chip 1 (D0) and of good chip 3 (D'0), respectively, collide with each other causing a problem in the condition wherein both bare chip 1 (D0) and of good chip 3 (D'0) are in operation.

Then, in the semiconductor memory module of the present embodiment, the QFC pin of bare chip 1, which has been detected as being defective, is fixed at a predetermined potential. Thereby, input/output of a signal from/to the data input/output terminal of this bare chip 1 is disabled, that is to say, bare chip 1 is converted to the deactivated condition. Accordingly, the above described problem is prevented from occurring in the semiconductor memory module of the present embodiment.

Here, a QFC pad, to which a QFC pin is connected, is electrically connected to electrical wire 20 that penetrates module substrate 2 from the front surface through the rear surface, as shown in FIG. 15. Therefore, it is possible to fix the QFC pin at a predetermined potential from the outside even after bare chip 1 is covered with mold resin 8.

In addition, internal circuit configurations of bare chip 1 and repair chip 3, respectively, are circuit configurations wherein input/output of data from/to the data input/output terminal of bare chip 1 is not carried out when the potential of the QFC pin is fixed at a predetermined potential.

Figure 19:
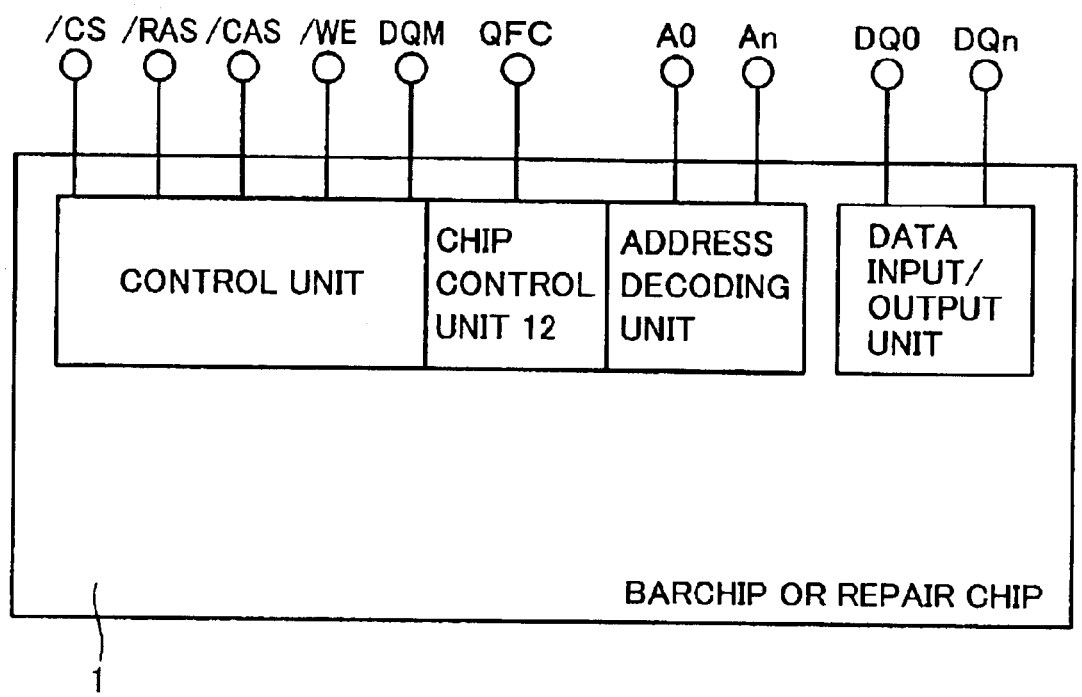
FIG. 19 is a diagram for describing an internal circuit of a bare chip of a semiconductor memory module of the fifth embodiment.

In the case that the QFC pins are OPEN, for example, as shown in FIG. 17, bare chips 1 (D0 to D7) and good chips 3 (D'0 to D'7), respectively, output data from a data input/output unit 24, shown in FIG. 19, to data input/output terminals DQ0 to DQ 63 or input data from data input/output terminals DQ0 to DQ 63 to data input/output unit 24, shown in FIG. 19, according to the work of a chip control unit 12, shown in FIG. 19.

Here, chip control unit 24 is provided with a circuit for activation/deactivation control, shown in FIGS. 9 to 11, of the above described the first or second embodiment, in order to prevent input/output of data from/to the data input/output terminals of bare chips 1 and repair chips 3, respectively, when the potential of the QFC pins is fixed at a predetermined potential.

Accordingly, in the case that the QFC pins of bare chips 1 and repair chips 3, respectively, are fixed at the ground potential (GND), bare chips 1 (D0 to D7) and good chips 3 (D'0 to D'7), respectively, stop the input of a signal from data input/output terminal DQ or the output of a signal from data input/output terminal DQ by using data input/output unit 24, shown in FIG. 19, due to the work of chip control unit 12, shown in FIG. 19.

Accordingly, in the case that none of bare chips 1 are detected as being a defective product, it is unnecessary to mount a good function chip 3 (D'0 to D'7) and it becomes possible to implement a semiconductor memory module wherein the plurality of bare chips 1 are directly mounted on module substrate 2.

In addition, at the time of operation of the semiconductor memory module having no defective bare chips 1, the QFC pins not utilized at the time of actual operation in bare chips 1 (D0 to D7) are normally in the condition of OPEN and chip control unit 12 carries out signal output from bare chips 1 (D0 to D7) to data input/output terminals DQ0 to DQ63 or carries out signal input from data input/output terminals DQ0 to DQ63 to bare chips 1 (DQ).

On the other hand, in the case that a bare chip 1 is detected as being a defective product from among bare chips 1 (D0 to D7) in the semiconductor memory module, a good function chip 3 (D'0 to D'7) is mounted on the rear side of module substrate 2 opposite to the surface on which bare chips 1 are provided and the QFC pin of bare chip 1 (D0) is fixed at the ground potential (GND).

Thereby, defective bare chip 1 (D0) stops output of a signal to data input/output terminals DQ0 to DQ7 or stops input of a signal from data input/output terminals DQ0 to DQ7.

As a result, good chip 3 (D'0) outputs data to data input/output terminals DQ0 to DQ7 or inputs data from input/output terminals DQ0 to DQ7 without interference from input/output of data from defective bare chip 3. Accordingly, the semiconductor memory module can be repaired by replacing defective bare chip 1 with good chip 3.

According to the semiconductor memory module of the present embodiment, the QFC pin of a defective bare chip, which is a pin not utilized at the time of normal operation, is fixed at the ground potential or at the power supply potential, thereby the defective bare chip can be converted to the deactivated condition. In addition, an electrical wire 20 that penetrates module substrate 2 from the front surface through the rear surface is provided in a position wherein the ground pad (GND) or the power supply pad of good chip 3 and the QFC pad of bare chip 1 are electrically connected to each other under the condition wherein good chip 3 is mounted in a good function chip mounting provision region. Accordingly, conversion of defective bare chip 1 to the deactivated condition only requires the labor of the mounting of good chip 3 and, thus, the semiconductor memory module can be completely repaired.

According to the above described semiconductor memory module of the present embodiment, good chip 3 that functions so as to substitute for defective bare chip 1 is mounted after a test is carried out on the bare chip module, thereby bare chips 1 that function properly can be effectively utilized. As a result, the yield of the semiconductor memory module can be increased.

In addition, the ground pad GND (P) or the power supply pad of good chip 3 is used as a means for converting defective bare chip 1 to the deactivated condition and, therefore, a part dedicated for repair is unnecessary. Accordingly, the manufacturing cost of the semiconductor memory module can be reduced and the yield of the semiconductor memory module can be increased.

In addition, the potential of the QFC pad of bare chip 1, which has not been conventionally utilized, is fixed at a predetermined potential so as to convert defective bare chip 1 to the deactivated condition and, therefore, the semiconductor memory module can be repaired without increasing the area of module substrate 2 occupied by bare chips 1.

(Sixth Embodiment)

Next, a semiconductor memory module of the sixth embodiment will be described in reference to FIGS. 20 to 24. First, before describing the semiconductor memory module of the present embodiment, a virtual semiconductor memory module concerning the semiconductor memory module of the present embodiment shown in FIG. 20 will be described.

In the virtual semiconductor memory module, one extra bare chip 1, in addition to the necessary bare chips 1, is mounted on a module substrate 2. That is to say, in the virtual semiconductor memory module, nine bare chips are mounted on module substrate 2 in the case that a memory capacity of eight bare chips is required.

In the manufacturing process of this virtual semiconductor memory module, a system test is carried out in order to determine whether or not the bare chips function properly at the point in time when nine bare chips 1 are mounted on module substrate 2. In some cases, one bare chip 1 from among the nine bare chips is detected as being defective according to this system test.

In such a case, one spare bare chip 1 mounted as an extra bare chip is made to function so as to substitute for bare chip 1 that has been detected as being defective by changing the program written in a repair circuit 200. As a result, the virtual semiconductor memory module can achieve the required memory capacity.

That is to say, repair circuit 200 is connected to data input/output terminals DQ of the plurality of bare chips mounted on module substrate 2 so that it becomes possible to write in repair circuit 200 a program for selecting which bare chip, from among the plurality of bare chips 1, data is to be inputted to/outputted from.

Accordingly, in the case that there are no defective products at all from among the plurality of bare chips 1 mounted on module substrate 2, a conventional program is written into repair circuit 200 so that repair circuit 200 carries out input/output of data vis-à-vis each of eight bare chips 1, other than one predetermined spare bare chip 1.

Figure 20:
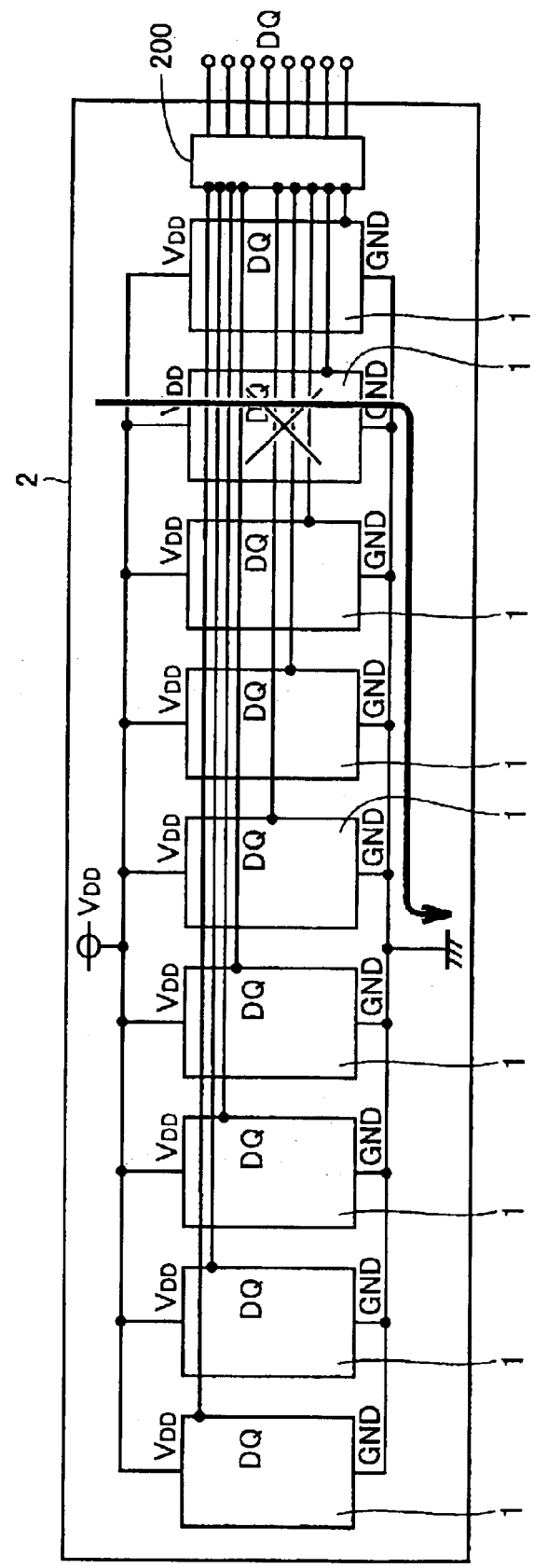
FIG. 20 is a diagram for describing a virtual semiconductor memory module of a sixth embodiment.

Here, as shown in FIG. 20, eight data input/output terminals DQ are electrically connected to repair circuit 200. Repair circuit 200 uses eight data input/output terminals DQ so as to carry out input/output of data between each of eight bare chips 1 utilized after the completion of the semiconductor memory module from among the nine bare chips mounted on module substrate 2 and a terminal outside of module substrate 2.

On the other hand, in the case that a defective product is detected from among the plurality of bare chips 1 mounted on module substrate 2, the program is rewritten in repair circuit 200 so that data inputted from the respective eight data lines other than one data line connected to bare chip 1 that has been detected as being defective can be outputted from eight data input/output terminals DQ. In addition, the program is rewritten in repair circuit 200 so that data inputted from eight data input/output terminals DQ, respectively, can be outputted to bare chips 1 other than bare chip 1 that has been detected as being defective.

Figure 21:
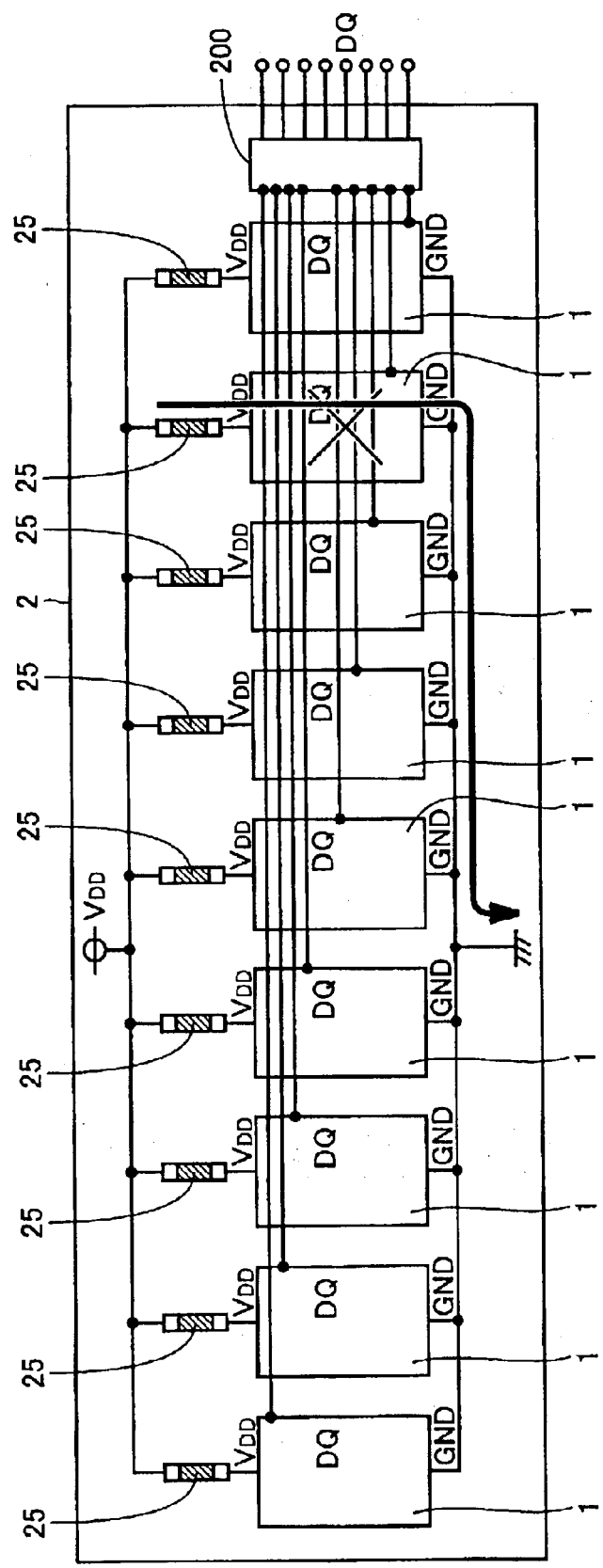
FIG. 21 is a diagram for describing a semiconductor memory module before repair of the sixth embodiment.
Figure 22:
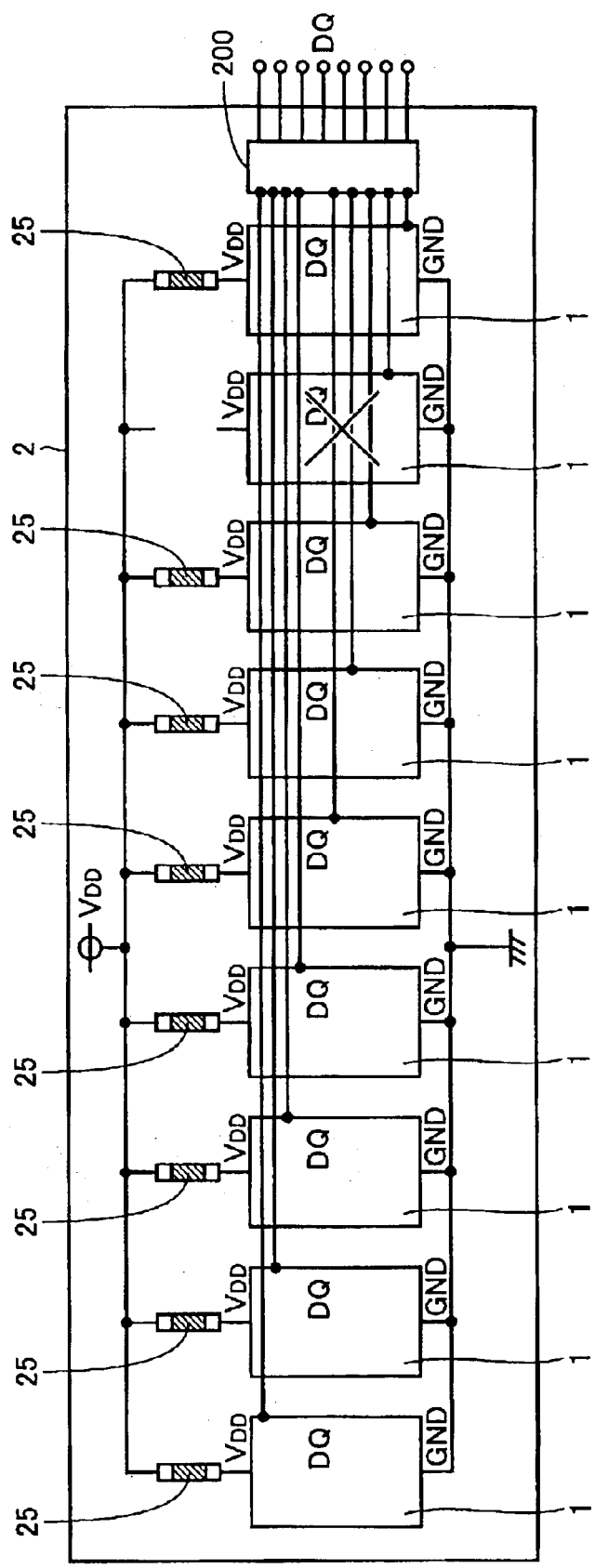
FIG. 22 is a diagram for describing a semiconductor memory module after repair of the sixth embodiment.

Here, eight data input/output terminals DQ and eight data lines connected to bare chip 1 are each collectively depicted as one line in FIGS. 20 to 22.

Accordingly, in the semiconductor memory module of the present embodiment, repair circuit 200 wherein the program is rewritten carries out input/output of data vis-à-vis eight bare chips 1 other than one bare chip 1 that has been detected as being a defective product, thereby data is inputted to/outputted from eight data input/output terminals DQ under the condition wherein the necessary memory capacity is maintained even in the case that bare chip 1 that has been detected as being defective is included among the nine bare chips 1.

In the virtual semiconductor memory module shown in FIG. 20, however, bare chips 1 share power supply terminal $V_{DD}$ and ground terminal GND. Therefore, in the case that a defect that has occurred in bare chip 1 is a defect concerning the power supplied to bare chip 1, it is possible that this defect concerning the power may have negative effects on the other bare chips 1. For example, in the case that power supply terminal $V_{DD}$ and ground terminal GND are short circuited in bare chip 1, a great amount of current flows through the route shown by the arrow in FIG. 20.

Accordingly, in the case that there is such a defect concerning power, the virtual semiconductor memory module cannot be repair and, therefore, the virtual semiconductor memory module is discarded. That is to say, though the virtual semiconductor memory module can be repaired by using the functions of repair circuit 200 with respect to a defect in input/output of data, a defect with respect to power supply between a bare chip and the power supply such that current flows as shown by the arrow in FIG. 20 cannot be dealt with.

Then, a semiconductor memory module, such as the semiconductor memory module of the present embodiment shown in FIGS. 21 to 24, becomes necessary having a structure wherein it becomes possible to electrically disconnect a defective bare chip from the power supply terminal in the case that a defect with respect to power has been detected in the bare chip. The semiconductor memory module of the present embodiment will be described in the following.

FIG. 21 shows a semiconductor memory module in the condition immediately after a plurality of bare chips 1 has been mounted, with electrical wires 20 connected, on a module substrate 2 and before repair. As shown in FIG. 21, the plurality of bare chips 1 mounted on module substrate 2 is connected to common power supply terminal $V_{DD}$ via chip resistance elements 25, respectively. Here, in the semiconductor memory module of the present embodiment shown in FIGS. 21 and 22, repair circuit 200 has the same functions as repair circuit 200 of the above described virtual semiconductor memory module.

A system test is carried out on the semiconductor memory module in this condition. In the case that one bare chip 1, for example, is detected as being defective from among nine bare chips 1 according to this system test, a chip resistance element 25 connected to bare chip 1 that has been detected as being defective is removed as shown in FIG. 22. Thereby, bare chip 1 that has been detected as being defective and power supply terminal $V_{DD}$ are electrically disconnected. Here, through chip resistance element 25 is used in the semiconductor memory module of the present embodiment, it need not be a removable chip resistance element as long as it is a wire that can be cut by using a laser or a machine tool.

In such a configuration, the semiconductor memory module can be repaired by effectively utilizing the remaining eight bare chips 1 even in the case that a defect with respect to power has been detected in a bare chip 1.

Figure 23:
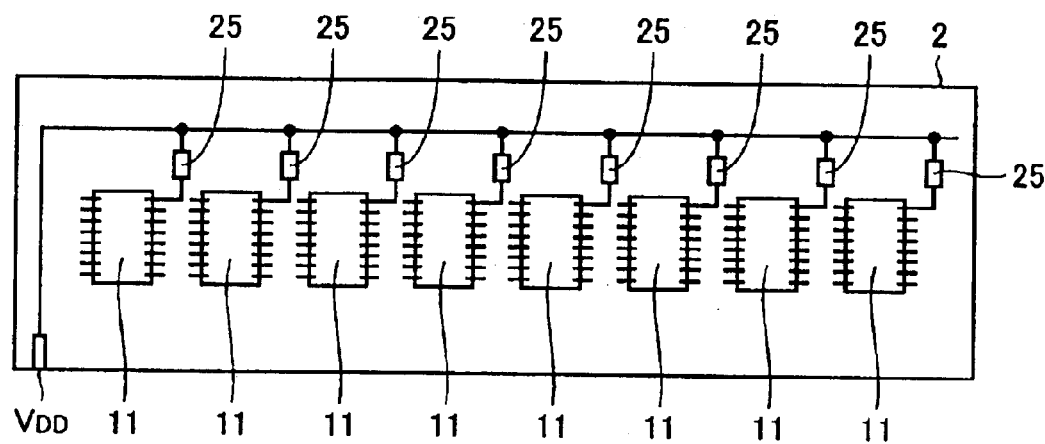
FIG. 23 is a diagram for describing a condition wherein single chips are used in a semiconductor memory module of the sixth embodiment.

In addition, bare chips 1 are mounted on module substrate 2 in the semiconductor memory module of the present embodiment. However, the same effects can also be obtained as in the semiconductor memory module of the present embodiment in a semiconductor memory module wherein single chips 11, where single bare chips are covered with a mold resin, are mounted on module substrate 2 and wherein chip resistance elements 25 make electrical connections between single chips 11 and power supply electrode $V_{DD}$, as shown in FIG. 23.

Figure 24:
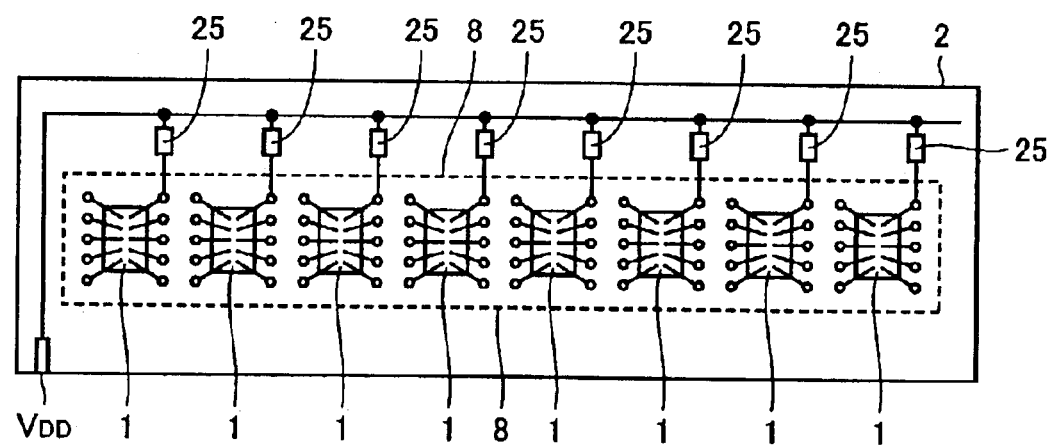
FIG. 24 is a diagram for describing a condition wherein bare chips are used in a semiconductor memory module of the sixth embodiment.

Here, in the semiconductor memory module of the present embodiment, as shown in FIG. 24, the plurality of bare chips 1 may be integrally covered with mold resin 8 on module substrate 2 in the same manner as in the semiconductor memory modules of the first to fifth embodiments.

At this time, it is desirable for chip resistance elements 25 to be provided outside of mold resin 8. In such a configuration, the semiconductor memory module can be repaired by removing chip resistance element 25 even after the plurality of bare chips 1 are integrally covered with mold resin 8.

(Seventh Embodiment)

Next, a semiconductor memory module of the seventh embodiment will be described in reference to FIGS. 25 to 30. Here, it is possible to use the semiconductor memory module of the present embodiment for an SDRAM or a DDRSDRAM.

A ground terminal GND of which the potential is fixed at the ground potential, a power supply terminal $V_{DD}$ of which the potential is fixed at the power supply potential, a master clock terminal CLK to which a clock signal that chronographically repeats the same status change is inputted, an inverted clock terminal /CLK to which an inverted clock signal wherein the status of the clock signal is inverted is inputted, a clock enabling terminal CKE to which a clock enabling signal for allowing inputs of the clock signal and the inverted clock signal is inputted, and data input/output terminals DQ0, DQ1, DQ2, DQ3, ... and DQ63 for carrying out input/output of data vis-à-vis the outside are provided on a module substrate 2 in the semiconductor memory module of the present embodiment.

Master clock terminal CLK, inverted clock terminal /CLK and clock enabling terminal CKE, respectively, provided on module substrate 2 are connected to master clock terminal CLK, inverted clock terminal /CLK and clock enabling terminal CKE, respectively, of corresponding bare chip 1 via corresponding resistance element 13.

In addition, data input/output terminals DQ0, DQ1, DQ2, DQ3, . . . and DQ63 provided on module substrate 2 are connected to data input/output terminals DQ0, DQ1, DQ2, DQ3, . . . and DQ63, respectively, of the plurality of bare chips 1 mounted on module substrate 2 via resistance elements 15. In addition, the plurality of bare chips 1, together with the main surface of module substrate 2, are integrally covered with a mold resin 8.

Figure 25:
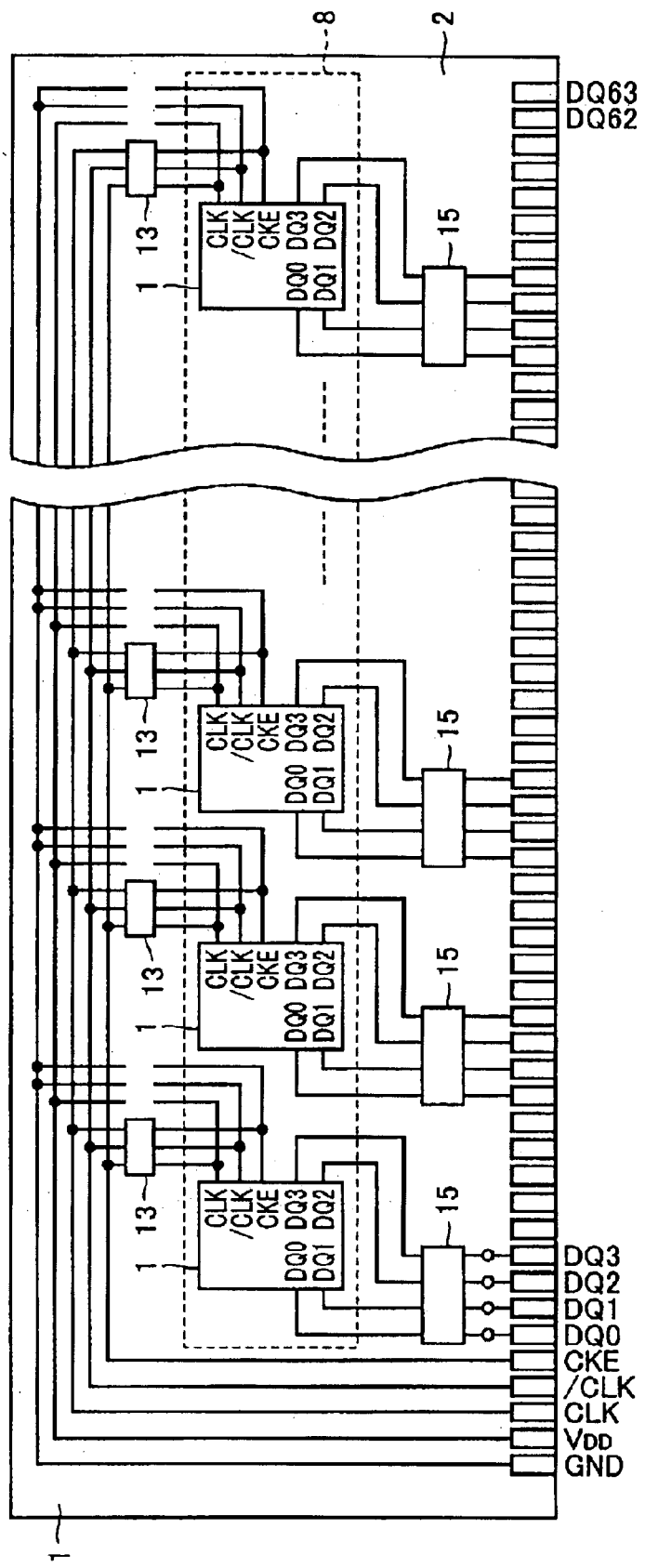
FIG. 25 is a diagram for describing a semiconductor memory module before repair of a seventh embodiment.
Figure 26:
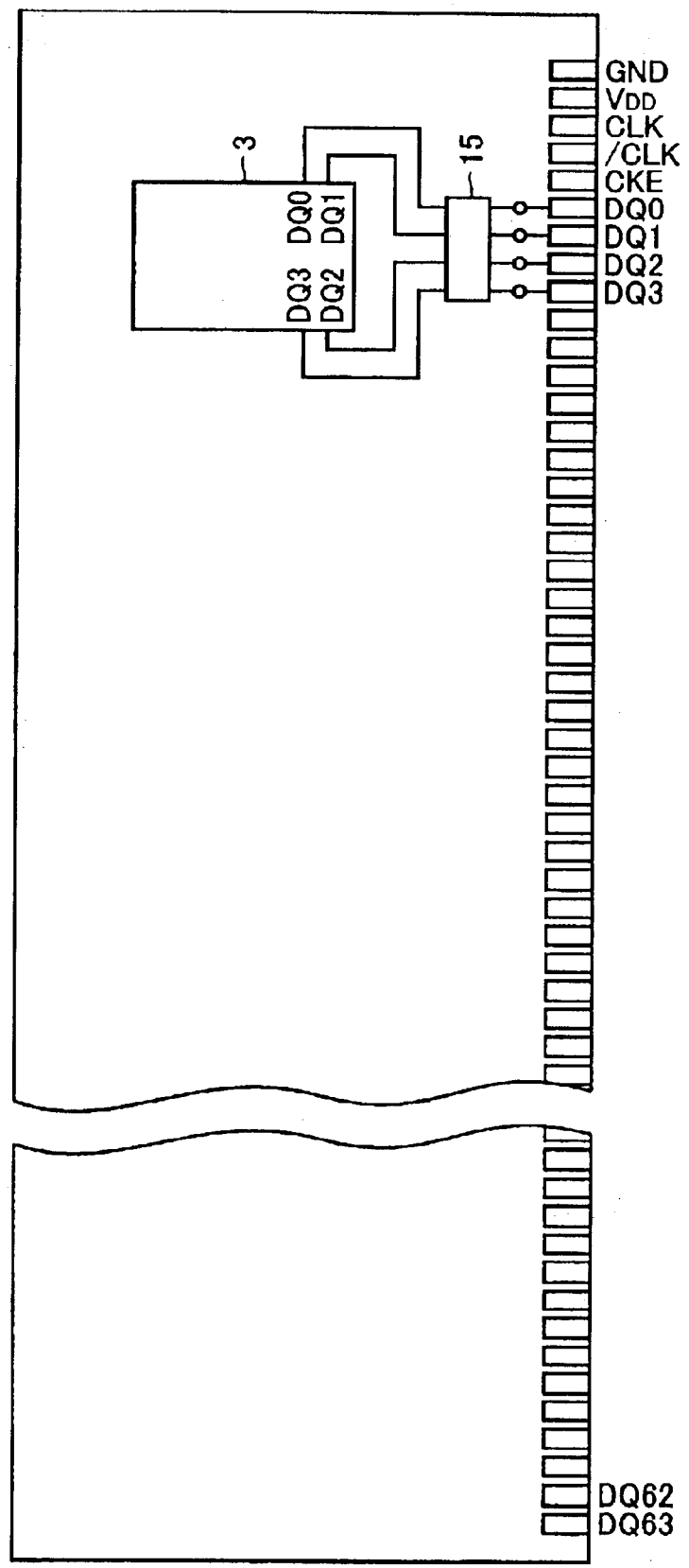
FIG. 26 is a diagram for describing a good function chip mounted on the rear surface of the module substrate in a semiconductor memory module of the seventh embodiment.

In the case that any bare chip 1 is detected as being defective from among the plurality of bare chips 1 shown in FIG. 25 according to a system test after the plurality of bare chips 1 is mounted on module substrate 2, as shown in FIG. 26, a good function chip 3 that functions so as to substitute for bare chip 1 that has been detected as being defective and a resistance element 15 are mounted on the rear surface of module substrate 2.

Thereby, data input/output terminals DQ0, DQ1, DQ2 and DQ3 of good chip 3 and data input/output terminals DQ0, DQ1, DQ2 and DQ3 provided on module substrate 2 are electrically connected to each other so that good chip 3 carries out input/output of data from data input/output terminals DQ0, DQ1, DQ2 and DQ3 in place of bare chip 1 that has been detected as being defective.

Here, though not shown in FIG. 26, master clock terminal CLK, inverted clock terminal /CLK and clock enabling terminal CKE, respectively, provided on module substrate 2 are electrically connected to master clock terminal CLK, inverted clock terminal /CLK and clock enabling terminal CKE, respectively, of corresponding good chip 3 via the corresponding resistance element.

At this time, in the case that data input/output terminals DQ0, DQ1, DQ2 and DQ3 of bare chip 1 that has been detected as being defective are left electrically connected to data input/output terminals DQ0, DQ1, DQ2 and DQ3 provided on module substrate 2, both pieces of data inputted/outputted by bare chip 1 and of data outputted by good chip 3 collide with each other at data input/output terminals DQ0, DQ1, DQ2 and DQ3 provided on module substrate 2.

Figure 27:
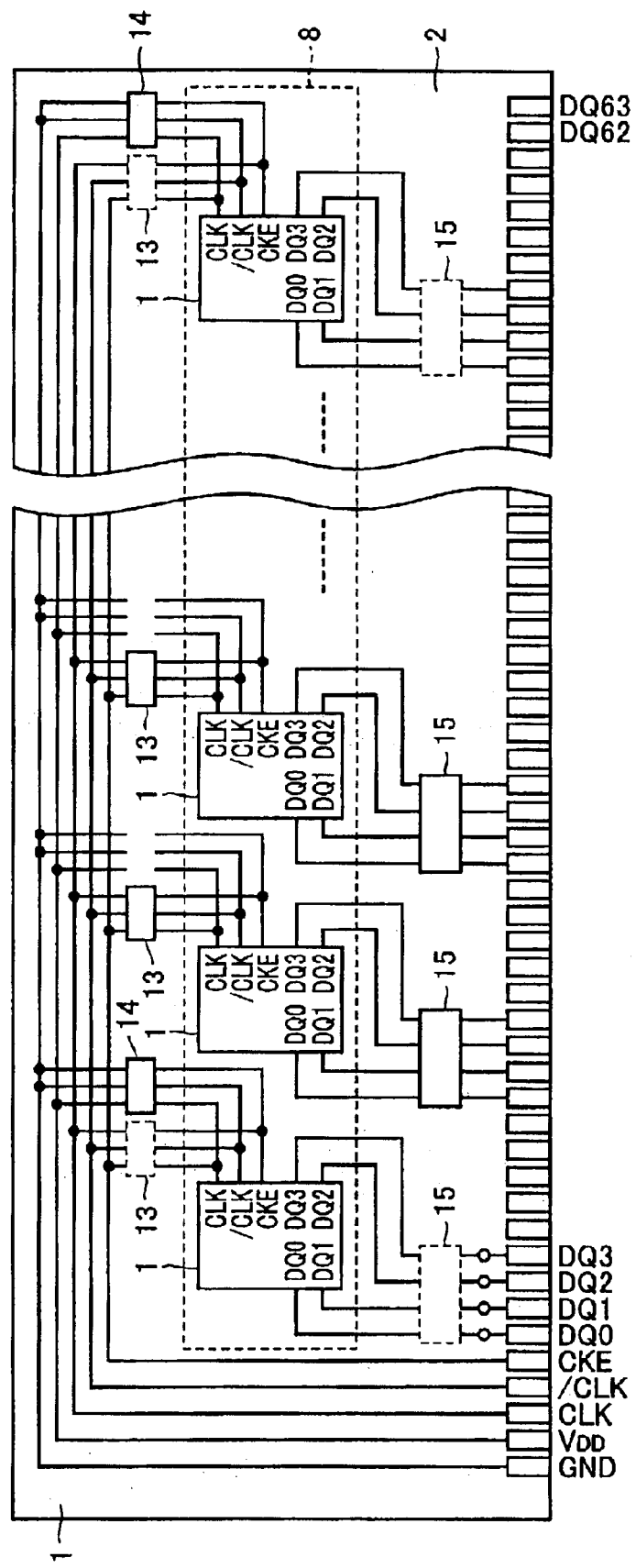
FIG. 27 is a diagram for describing a semiconductor memory module after repair of the seventh embodiment.
Figure 29:
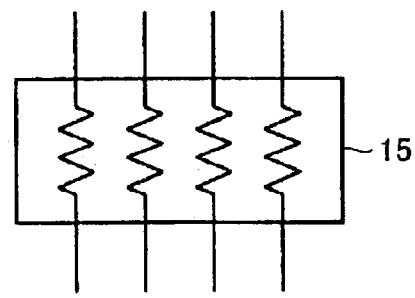

Then, resistance element 15, shown in FIG. 29, electrically connected to bare chip 1 that has been detected as being defective is removed as shown in FIG. 27. Thereby, data of bare chip 1 that has been detected as being defective is prevented from being inputted/outputted from data input/output terminals DQ0 to DQ3 of module substrate 2.

As a result, collision of data from two chips at data input/output terminals DQ occurring due to the electrical connections, to data input/output terminals DQ of module substrate 2, of both good chip 3 and bare chip 1 that has been detected as being defective according to a system test can be prevented without removing bare chip 1 that has been detected as being defective from module substrate 2.

Here, in resistance element 15, as shown in FIG. 29, four resistors are connected to data input/output terminals DQ0 to DQ3, respectively, in a one-to-one manner. The four resistors of the present embodiment, respectively, are independently removable and it is desirable to provide units that allow the four resistors to be removed integrally. In the case that the four resistors are in units in such a manner, the period of time for repairing the semiconductor memory module can be shortened and the semiconductor memory module can easily be repaired.

Figure 28:
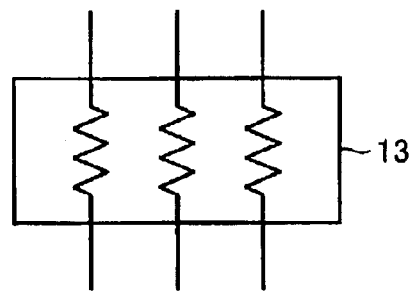
FIGS. 28 and 29 are diagrams for describing resistance elements of a semiconductor memory module of the seventh embodiment.

In addition, resistance element 13, shown in FIG. 28, electrically connected to bare chip 1 that has been detected as being defective is removed as shown in FIG. 27. Thereby, a clock signal and an inverted clock signal are prevented from being inputted to bare chip 1 that has been detected as being defective. Therefore, it becomes possible to eliminate unnecessary power consumption due to input of signals to bare chip 1 that has been detected as being defective from master clock terminal CLK and inverted dock terminal /CLK, respectively.

Here, in resistance element 13, as shown in FIG. 28, three resistors are connected to master clock terminal CLK, inverted clock terminal /CLK and clock enabling terminal CKE, respectively, in a one-to-one manner. In addition, the three resistors of the present embodiment, respectively, are removable independently and it is desirable to provide units that allow the three resistors to be removed integrally. In the case that the three resistors are in units in such a manner, the period of time for repairing the semiconductor memory module can be shortened and semiconductor memory module can be repaired.

Figure 30:
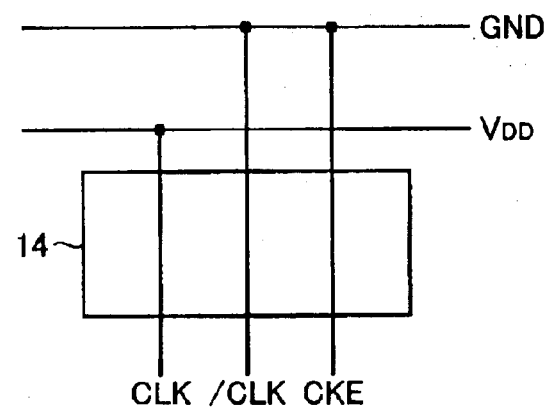
FIG. 30 is a diagram for describing a conductive connection element of a semiconductor memory module of the seventh embodiment.
Figure 31:
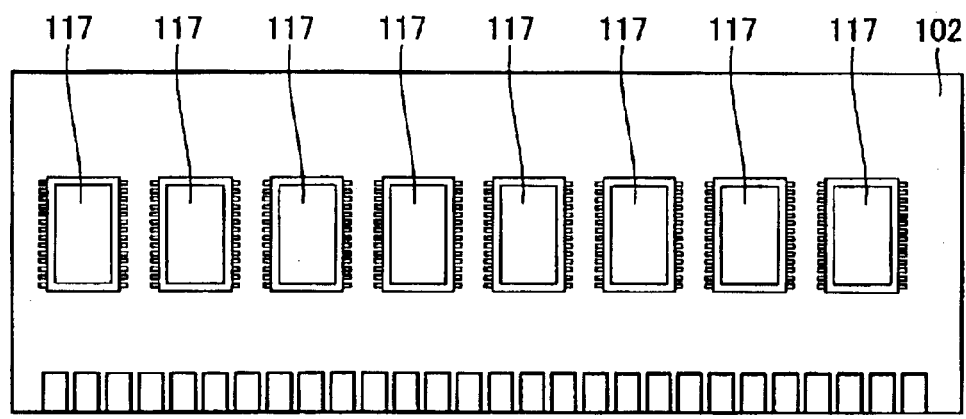
FIGS. 31 and 32 are views for describing a semiconductor memory module according to a prior art.
Figure 32:
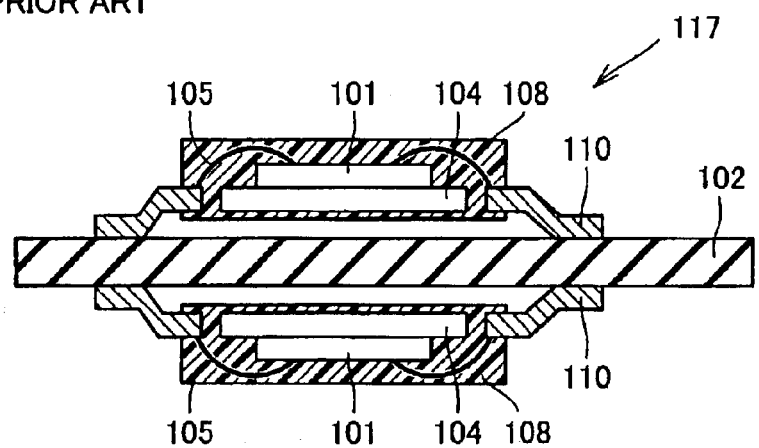

Furthermore, it is desirable for conductive connection element 14 shown in FIG. 30 to be mounted on module substrate 2 after repair in order to electrically connect power supply terminal $V_{DD}$ of module substrate 2 to master clock terminal CLK of bare chip 1 as well as in order to electrically connect ground terminal GND of module substrate 2 to inverted clock terminal /CLK and clock enabling terminal CKE, respectively, provided in bare chip 1.

Thereby, in bare chip 1 that has been detected as being defective, the potential of master clock terminal CLK is fixed at the ground potential and the potentials of inverted clock terminal /CLK and of clock enabling terminal CKE, respectively, are fixed at the power supply potential. Thereby, bare chip 1 does not malfunction and an unnecessary amount of power is prevented from being consumed. Here, the conductive connection element may be any of a wire, an aluminum wire or a copper wire as long as it is an electrical wire.

Described more concretely, the semiconductor memory module of the present embodiment has the following characteristics.

In the semiconductor memory module such as of an SDRAM, an internal circuit provided inside of bare chip 1 is, for example, a circuit that is formed so as to operate, as shown in FIG. 8, only when a clock signal is inputted to master clock terminal CLK and an inverted clock signal is inputted to inverted master clock terminal /CLK.

In other words, the internal circuit provided inside of bare chip 1 is a circuit that does not operate unless a clock signal and an inverted clock signal, respectively, are inputted to master clock terminal CLK and inverted master clock terminal /CLK, respectively. As a result, bare chip 1 becomes of the deactivated condition unless a clock signal and an inverted clock signal are inputted to master clock terminal CLK and inverted master clock terminal /CLK, respectively.

Accordingly, in the case that master clock terminal CLK, inverted clock terminal /CLK and inverted master clock terminal /CLK, respectively, are electrically fixed so that the internal circuit does not operate, bare chip 1 that has been detected as being defective is prevented from malfunctioning.

Here, conductive connection element 14 is formed of three electrical wire elements as shown in FIG. 30. These three electrical wire elements are connected to master clock terminal CLK, inverted clock terminal /CLK and clock enabling terminal CKE, respectively, in a one-to-one manner. In addition, in the semiconductor memory module of the present embodiment, these three electrical wire elements, respectively, are removable independently. However, it is desirable to provide units that allow the three electrical wire elements to be removed integrally. In the case that the three electrical wires are in units in such a manner, the period of time for repairing the semiconductor memory module can be shortened and the semiconductor memory module can easily be repaired.

In addition, in the semiconductor memory module of the present embodiment, resistance elements 13, 15 and conductive connection element 14, respectively are provided outside of mold resin 8 as shown in FIGS. 25 and 27. Therefore, the semiconductor memory module can be repaired even after the plurality of bare chips 1 is integrally covered with mold resin 8.

Here, though in the semiconductor memory module of the present embodiment, bare chips are used as semiconductor chips mounted on module substrate 2, the same effects as the effects obtained by the semiconductor memory module of the present embodiment can be obtained even in the case that the semiconductor chips mounted on module substrate 2 are single chips individually molded into resin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory module having a plurality of units mounted on a module substrate, wherein each of the units has:

a data input/output part electrically connected to a semiconductor chip for inputting/outputting data to/from the semiconductor chip;

a deactivated condition signal input part to which a deactivated condition signal for indicating conversion to a deactivated condition wherein data that has been inputted from the data input/output part is not inputted to a data memory region of said semiconductor chip; and a circuit for activation/deactivation control provided within said semiconductor chip which carries out conversion to said deactivated condition an the case that said deactivated condition signal is inputted from said deactivated condition signal input part, said plurality of semiconductor chips include a plurality of bare chips, the plurality of bare chips on said module substrate is integrally covered with a mold resin, and said deactivated condition signal input part is provided outside of said mold resin.

2. A semiconductor memory module having a plurality of units mounted on a module substrate, wherein each of the units has:

a data input/output part electrically connected to a semiconductor chip for inputting/outputting data to/from the semiconductor chip;

a fuse for activation/deactivation control that can select, according to the mode of being blown or the mode of staying unblown, whether said semiconductor chip is converted to an activated condition or is converted to a deactivated condition; end a circuit for activation/deactivation control provided within said semiconductor chip for conversion to the deactivated condition wherein data that has been inputted from said data input/output part is not inputted to a data memory region of said semiconductor chip in accordance with the mode of said fuse for activation/deactivation control.

3. The semiconductor memory module according to claim 2, wherein said plurality of semiconductor chips include a plurality of bare chips, the plurality of bare chips on said module substrate is integrally covered with a mold resin, and said fuse for activation/deactivation control is provided outside of said mold resin.

4. A semiconductor memory module having a plurality of units mounted on a module substrate, wherein each of the units has:

a good function chip mounting provision region provided on a module substrate wherein a good function chip, which functions in place of a semiconductor chip mounted on the module substrate, can be mounted;

a signal input part electrically connected to a fixed potential terminal of which the potential is fixed, to which a predetermined signal is inputted; and a semiconductor chip internal circuit for converting said semiconductor chip into the deactivated condition in the case that a predetermined signal has been inputted from the signal input part, said fixed potential terminal is provided in said good chip, and said module substrate is provided with an electrical wire for electrically connecting said fixed potential terminal to said signal input part under the condition wherein said good chip is mounted in said good chip mounting provision region.

5. The semiconductor memory module according to claim 4, wherein said signal input part is an unutilized pad that is not utilized at the time of normal operation of said semiconductor chip.

6. A semiconductor memory module, comprising:

a module substrate;

a plurality of semiconductor chips mounted on the module substrate;

a common power supply electrode to which the plurality of semiconductor chips is electrically connected;

a plurality of disconnectable wires that makes electrical connections between two or more respective semiconductor chips from among said plurality of semiconductor chips, and said power supply electrode; and a data input/output circuit for allowing data to be inputted/outputted in the case that a specific semiconductor chip is detected as being defective from among said plurality of semiconductor chips, by using a semiconductor chip other than the specific semiconductor chip.

7. The semiconductor memory module according to claim 6, wherein said plurality of semiconductor chips is formed of a plurality of bare chips on said module substrate integrally covered with a mold resin, and a portion of said plurality of disconnectable wires is provided outside of said mold resin.

* * * * *